United States Patent
Yanagi et al.

(10) Patent No.: US 8,077,509 B2
(45) Date of Patent: Dec. 13, 2011

(54) MAGNETIC MEMORY

(75) Inventors: Satoshi Yanagi, Kanagawa-ken (JP);
Yuichi Ohsawa, Kanagawa-ken (JP);
Shiho Nakamura, Kanagawa-ken (JP);
Daisuke Saida, Tokyo (JP); Hirofumi Morise, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 462 days.

(21) Appl. No.: 12/320,955

(22) Filed: Feb. 10, 2009

(65) Prior Publication Data

US 2009/0207724 A1 Aug. 20, 2009

(30) Foreign Application Priority Data

Feb. 14, 2008 (JP) ................. 2008-033400

(51) Int. Cl.
G11C 11/15 (2006.01)
(52) U.S. Cl. .............. 365/173; 257/379; 257/536
(58) Field of Classification Search .......... 365/173, 365/171, 158, 230.03, 189.05, 189.01, 163, 365/148, 230.06; 257/379, 536, 539, 296, 257/421
See application file for complete search history.

(56) References Cited

U.S. PATENT DOCUMENTS

| | | | |
|---|---|---|---|
| 6,532,164 B2 | 3/2003 | Redon et al. | |
| 6,603,677 B2 | 8/2003 | Redon et al. | |
| 6,980,463 B2 * | 12/2005 | Hosotani et al. | 365/158 |
| 6,980,469 B2 | 12/2005 | Kent et al. | |
| 7,224,601 B2 | 5/2007 | Panchula | |
| 7,381,480 B2 * | 6/2008 | Nakamura et al. | 428/811.5 |
| 2002/0105823 A1 | 8/2002 | Redon et al. | |
| 2002/0105827 A1 | 8/2002 | Redon et al. | |
| 2006/0092696 A1 | 5/2006 | Bessho | |
| 2007/0047294 A1 | 3/2007 | Panchula | |
| 2007/0096229 A1 | 5/2007 | Yoshikawa et al. | |
| 2009/0015958 A1 | 1/2009 | Nakamura et al. | |

FOREIGN PATENT DOCUMENTS

| | | |
|---|---|---|
| JP | 2002-261352 | 9/2002 |
| JP | 2006-128579 | 5/2006 |
| JP | 2006-179694 | 7/2006 |
| JP | 2007-150265 | 6/2007 |

OTHER PUBLICATIONS

Albert, F.J. et al. "Spin-Polarized Current Switching of a Co Thin Film Nanomagnet", Applied Physics Letters, vol. 77, No. 23, pp. 3809-3811, (Dec. 4, 2000).
Kaka, S., et al. "Spin Transfer Switching of Spin Valve Nanopillars Using Nanosecond Pulsed Currents", Journal of Magnetism and Magnetic Materials, vol. 286, pp. 375-380, (2005).
Nakamura et al., U.S. Appl. No. 12/216,918, filed Jul. 11, 2008.

* cited by examiner

Primary Examiner — Dang Nguyen
(74) Attorney, Agent, or Firm — Nixon & Vanderhye, P.C.

(57) ABSTRACT

A magnetic memory is provided with a memory cell. The memory cell includes a magnetic recording element, an interconnection to generate a radio-frequency current-induced magnetic field and a ground line. The magnetic recording element is provided with a first magnetic layer whose magnetization direction is substantially fixed, a magnetic recording layer whose magnetization direction is substantially reversed by spin-polarized electrons passing through the magnetic recording layer and a first nonmagnetic layer provided between the first magnetic layer and the magnetic recording layer. The interconnection is provided above the magnetic recording element to generate a radio-frequency current-induced magnetic field acting in a direction substantially perpendicular to a magnetization easy axis of the magnetic recording layer. The ground line is provided on a side opposite to the magnetic recording element with respect to the interconnection.

16 Claims, 13 Drawing Sheets 0.1GHz

2GHz

4GHz

10GHz

15GHz

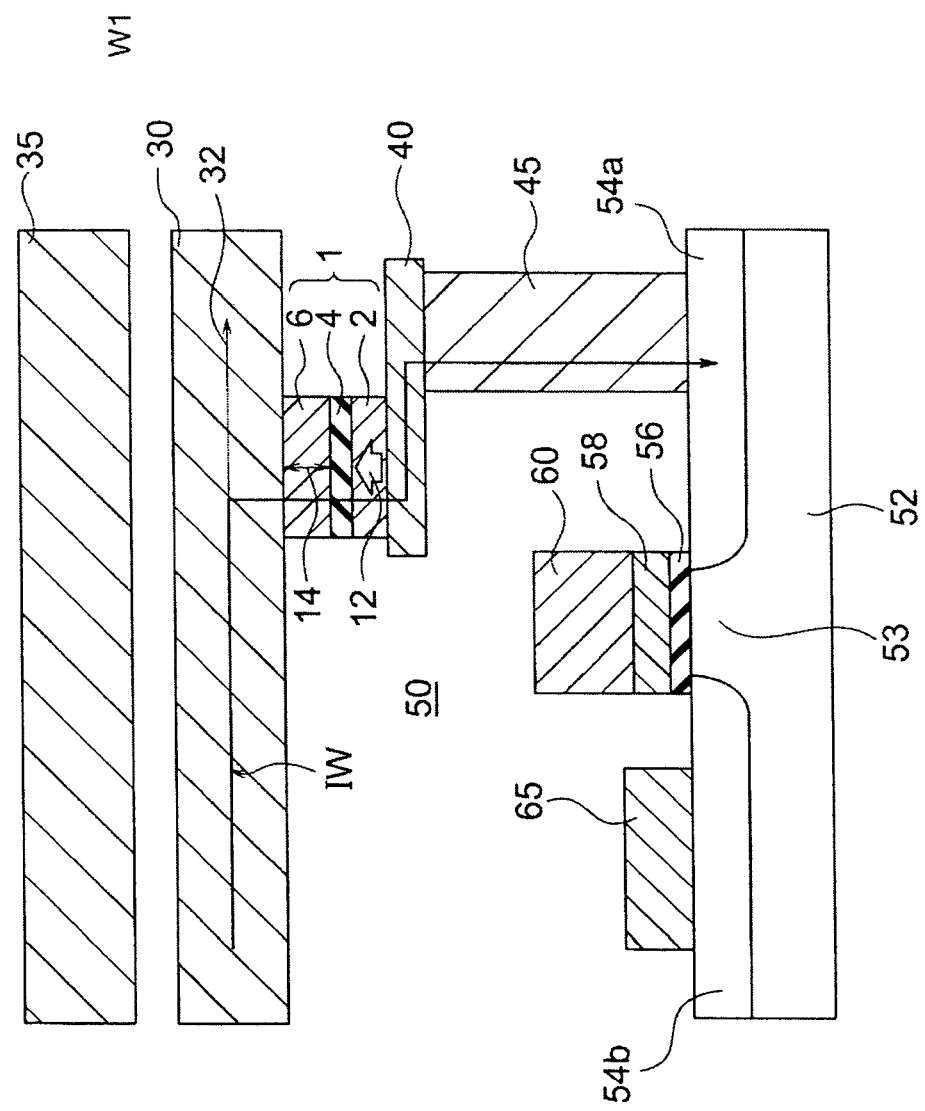
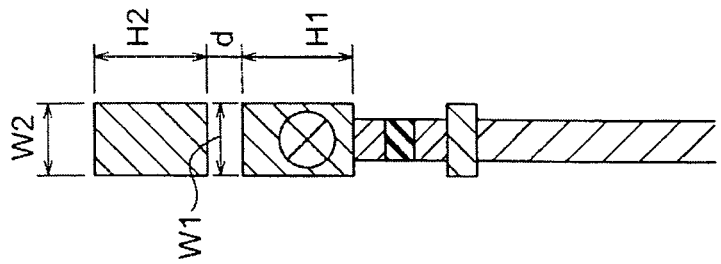
FIG. 14A
FIG. 14B

MAGNETIC MEMORY

CROSS REFERENCE TO RELATED APPLICATION

The application is based upon and claims the benefit of priority from the prior Japanese Patent Application No. 2008-033400, filed on Feb. 14, 2008, the entire contents of which are incorporated herein by reference.

FIELD OF THE INVENTION

The present invention relates to a magnetic memory, more particularly to a magnetic memory whose write-in is executed by applying a radio-frequency magnetic field as a subsidiary field simultaneously with passing a normal write-in current.

DESCRIPTION OF THE BACKGROUND

Applying a magnetic field has been known as a method of controlling a magnetization direction of a magnetic material. In, e.g., a hard disk drive, a magnetization direction of the medium is reversed by a magnetic field generated from a magnetic head to execute a write-in. In a magnetic random access memory, a magnetization direction of a memory cell is controlled by applying a current-induced magnetic field generated by passing a current to write-in lines provided near a magnetoresistive effect element included by the memory cell. The magnetization direction control by external magnetic fields has a long history, and can be taken as established technology.

On the other hand, along with a recent progress in nanotechnology, bit or cell size of magnetoresistive effect devices has been reduced. Accordingly, magnetization control must be done locally on a nanoscale. However, localizing a magnetic field is difficult, because the magnetic field fundamentally spreads spatially. This causes a problem of "cross talk". Even when a specific bit or cell is selected to control its magnetization direction, a magnetic field spreads to adjacent bits or cells and executes an incorrect write-in on the bits or cells. If a magnetic field generation source is made small to localize the magnetic field, sufficient magnetic fields cannot be generated.

A "current direct driving magnetization reversal method" has come to attract attention in order to avoid the above-mentioned problem (e.g., F. J. Albert, et al., Appl. Phy. Lett. 77, 3809 (2000)). In the method, a current is supplied to a magnetic layer of a magnetoresistive effect element to spin-polarize electrons. Spin-polarized electrons are caused to pass through a target magnetic layer to reverse its magnetization. More specifically, when an angular momentum of the spin-polarized electrons is transmitted to electrons of a magnetic material of the target magnetic layer, a magnetization direction of the magnetic material is reversed.

When the method is employed, by which the current can be caused to more directly act on the magnetic material, magnetic state of the magnetic material may be easily controlled on a nanoscale. The current for the magnetization reversal can also decrease according to miniaturization of the magnetoresistive effect element. Hence, the technique of the "spin-polarized current direct driving magnetization reversal" contributes to realizing spin electronics devices such as high-density hard disk drives or MRAMs.

A method of a spin torque switching assisted by an oscillating-field is disclosed in USPA0070047294. A magnetic memory according to the method is capable of addressing magnetic cells arrayed in a matrix with bit and word lines of the memory. Each magnetic cell is provided with a magnetoresistive effect element which has a layered structure consisting essentially of a ferromagnetic fixed layer/a tunnel barrier layer/a ferromagnetic free layer (magnetic recording layer), and is recorded according to a direction of current flowing across itself. Each magnetic cell is provided also with a switching element (transistor) connected to the magnetoresistive effect element in series. The magnetoresistive effect element of each magnetic cell is connected to a bit line. The switching element (transistor) is connected to a word line. Furthermore, the magnetic memory system has a DC power supply to send a DC current, and an AC power supply to generate an oscillating magnetic field at the time of recording.

The technique of the "spin-polarized current direct driving magnetization reversal" has a problem that an incomplete magnetization reversal often occurs, as a pulse width of a write-in current becomes short. The problem has been pointed out in a literature, e.g., Shehzaad Kakaa, et al., Journal of Magnetism and Magnetic Materials Vol. 286, (2005) p. 375. In order to avoid the problem, it is necessary to increase the write-in current more. An increase in the write-in current causes a further problem about reliability, i.e., characteristics of the magnetoresistive effect element deteriorates under an influence of heat generated within the element. In a magnetic memory using the spin-polarized current direct driving magnetization reversal method, the increase also leads to a problem being caused by miniaturizing selection transistors, i.e., by increasing memory capacity. Then, power consumption of the magnetic memory also increases to be a problem.

In such a magnetic memory described in USPA0070047294, it is not easy to fully flow a radio-frequency (RF) current having a frequency of several GHz or more through a single bit line or word line without a ground line in order to execute a write-in for the memory, causing a big problem.

SUMMARY OF THE INVENTION

An advantage of aspects of the invention is to provide a magnetic memory which is capable of reducing variations in "spin-polarized current direct driving magnetization reversals" and of achieving a reduction in the reversal current and a rapid magnetization reversal in the magnetic memory.

To achieve the above advantage, an aspect of the invention is to provide a magnetic memory which is provided with a memory cell. The memory cell comprises a magnetic recording element, an interconnection to generate a radio-frequency current-induced magnetic field and a ground line. The magnetic recording element comprises a first magnetic layer whose magnetization direction is substantially fixed, a magnetic recording layer whose magnetization is substantially reversed by a spin-polarized electron passing through the magnetic recording layer and a first nonmagnetic layer provided between the first magnetic layer and the magnetic recording layer. The interconnection is provided above the magnetic recording element to generate the radio-frequency current-induced magnetic field acting in a direction substantially perpendicular to a magnetization easy axis of the magnetic recording layer, by passing a radio-frequency current through the interconnection. The ground line is provided on a side opposite to the magnetic recording element with respect to the interconnection.

To achieve the above advantage, other aspect of the invention is to provide a magnetic memory which is provided with a memory cell. The memory cell includes a magnetic recording element, a bit line, an interconnection to generate a radio-frequency current-induced magnetic field and a ground line.

The magnetic recording element comprises a first magnetic layer whose magnetization direction is substantially fixed, a magnetic recording layer whose magnetization is substantially reversed by a spin-polarized electron passing through the magnetic recording layer and a first nonmagnetic layer provided between the first magnetic layer and the magnetic recording layer. The interconnection is provided on a side opposite to the magnetic recording element with respect to the bit line. The interconnection extends along a direction substantially perpendicular to a direction along which the bit line extends.

BRIEF DESCRIPTION OF THE DRAWINGS

FIGS. 14A and 14B are sectional views of a memory cell for a magnetic memory according to a second embodiment of the invention.

DETAILED DESCRIPTION OF THE INVENTION

Figure 1:
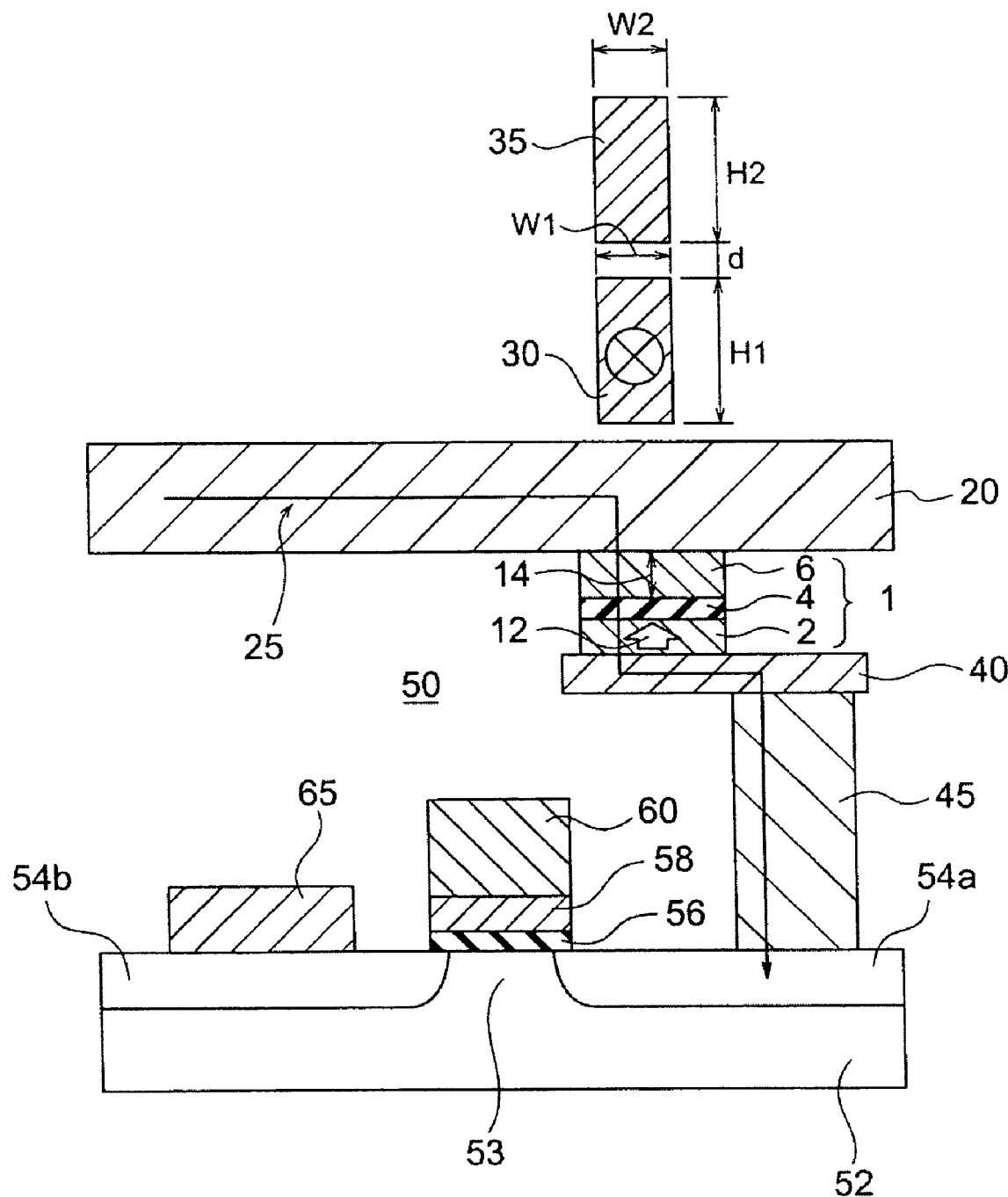
FIG. 1 is a sectional view showing a memory cell of a magnetic memory according to a first embodiment of the invention.

The embodiments of the present invention will be described below with reference to the accompanying drawings. The same reference numerals denote the same parts throughout the drawings.

First Embodiment

FIG. 1 is a schematic view showing a sectional structure of a magnetic memory according to a first embodiment of the invention. The magnetic memory of the embodiment is provided with a plurality of memory cells arrayed in a matrix and each cell is provided with a magnetic recording element 1, an interconnection 30 to generate a radio-frequency current-induced magnetic field, a ground line 35, an extraction electrode 40, a connecting plug 45 and a switching element 50. The interconnection to generate a radio-frequency current-induced magnetic field will be referred to as the "RF interconnection" hereinafter.

The magnetic recording element 1 is a magnetoresistive effect element and has a layered structure with a first magnetic layer 2, a first nonmagnetic layer 4, and a magnetic recording layer 6 laminated in this order. The first magnetic layer, the first nonmagnetic layer, the magnetic recording layer are referred to as the magnetic fixed layer, the nonmagnetic barrier layer and the magnetic recording layer, respectively, hereinafter. The magnetic fixed layer 2 includes a magnetic film whose spin moment is fixed. The magnetic recording layer 6 has a spin moment whose direction is variable. This layered structure is called an "MTJ (Magnetic Tunnel Junction)" etc. In the embodiment, the magnetic fixed layer 2 has a spin moment (a magnetization) which is fixed in a direction substantially perpendicular to the film surfaces of the above-mentioned magnetic films. The magnetic recording layer 6 has a spin moment whose direction can be parallel (the same direction), or anti-parallel (the opposite direction) to the direction of the spin moment of the above-mentioned fixed layer. The magnetic recording layer 6 has an easy axis of magnetization whose direction is substantially perpendicular to the film surface of the above-mentioned magnetic film. The direction of a spin moment coincides with that of the easy axis.

The magnetic fixed layer 2 has a first and second surface. The first surface is in contact with the extraction electrode 40 and the second surface is in contact with a nonmagnetic barrier layer 4. The magnetic fixed layer 2 is electrically connected to the extraction electrode 40. The magnetic recording layer 6 has a third and fourth surface. The third surface is in contact with the nonmagnetic barrier layer 4, and the fourth surface is in contact with a bit line 20. The magnetic recording layer 6 is electrically connected to the bit line 20. The bit line 20 is common to a plurality of memory cells provided on the same row.

The RF interconnection 30 is provided on a side opposite to the magnetic recording element 1 with respect to the bit line 20 such that the RF interconnection 30 extends along a direction substantially perpendicular to a direction along which the bit line 20 extends. The RF interconnection 30 is electrically insulated from the bit line 20 by an insulating film (not shown). The insulating film is provided between the RF interconnection 30 and the bit line 20. Therefore, an RF current with constant polarity passing through the RF interconnection 30 generates a current-induced magnetic field (will be referred to as a "current magnetic field" hereinafter). The current magnetic field is generated such that the field is applied in a direction (the direction of a hard axis) substantially perpendicular to the easy axis of the magnetic recording layer 6. The RF interconnection 30 may be provided anywhere, as long as the current magnetic field, generated by the RF current flowing into the RF interconnection 30, is applied in a direction substantially perpendicular to the easy axis of the magnetic recording layer 6.

The ground line 35 is provided a certain distance d away from the RF interconnection 30 on the side opposite to the bit line 20. The ground line 35 is electrically insulated from the RF interconnection 30 by the insulating film (not shown) provided between the interconnection 30 and the ground line 35.

The switching element 50 is an MOS transistor 50 provided with source/drain regions 54a and 54b separately-formed on a semiconductor substrate 52. The MOS transistor has a gate insulating film 56 formed on a region 53 to be a channel of the substrate 52 between the source region 54a and drain region 54b. The MOS transistor has a gate electrode 58 formed on the gate insulating film 56. The source region 54a is electrically connected to the extraction electrode 40 via the plug 45. The drain region 54b is connected to write-in or read-out circuitry (not shown) via an interconnection 65. The embodiment is configured such that the switching element 50 is connected to the magnetic recording element 1 in series. Therefore, a current can be passed to the write-in or read-out circuitry via the magnetic recording element 1, the extraction electrode 40, the connection plug 45, the switching element 50 and the interconnection 65 from the bit line 20, and vice versa. The gate electrode 58 is electrically connected to the word line 60. The gate electrode 58 of the switching element 50 of the memory cell provided on the same column is electrically connected to the same word line 60. The word line 60 connected to the gate 58 performs "turn-on" of the switching element 50.

The magnetization of the magnetic fixed layer 2 can be fixed firmly by an antiferromagnetic layer (not shown) provided adjacent to the magnetic fixed layer 2. The magnetic fixed layer 2 and the magnetic recording layer 6 may be a respectively single magnetic film, while both the layers 2 and 6 may be a layered structure of magnetic films ferromagnetically coupled or antiferromagnetically coupled with respect to one another via nonmagnetic films. The magnetic fixed layer 2 and the magnetic recording layer 6 may be a three-layer structure with a magnetic film/nonmagnetic film/magnetic film or a five-layer structure with a magnetic film/nonmagnetic film/magnetic film/nonmagnetic film/magnetic film. The nonmagnetic barrier layer 4 consists essentially of a nonmagnetic insulating material or semiconductor with a high resistance.

The magnetization direction of the magnetic recording layer 6 can be controlled by passing an electron current 25 between the magnetic recording layer 6 and the magnetic fixed layer 2 in the magnetic recording element according to the embodiment. Specifically, the magnetization direction of the magnetic recording layer 6 can be reversed by changing the flowing direction (polarity) of the electron current 25. What is necessary is to assign "0" and "1", respectively, according to the magnetization directions of the magnetic recording layer 6 in order to record information.

The shapes of the RF interconnection 30 and the ground line 35 are explained according to the embodiment. The RF interconnection 30 facing the ground line 35 has a surface whose width and height are W1 and H1, respectively. The ground line 35 facing the RF interconnection 30 has a surface whose width and height are W2 and H2, respectively. The gap d exists between the RF interconnection 30 and the ground line 35. It is preferable that the above-mentioned W1, W2, H1, H2 and d meet the following conditions.

$$H1 \geq d \geq W1/10$$

$$H2 \geq d \geq W2/10$$

$H1 \geq d$ and $d \geq W1/10$ express an upper and lower limit, respectively, below and above which the RF interconnection can couple with the ground line without problems of interference. It is furthermore preferable that $2\times(H1+d) \leq H2$ is met. If the ground line 35 covers as a spread of electric flux lines up to about two times the distance (H1+d) from the opposite lower surface of the RF interconnection 30, most of all the electric flux lines can be absorbed by the ground line. It is also preferable that $d<500$ μm is met. Five hundred μm is an upper limit up to which each electrode is coupled with each other efficiently, and estimated from a dielectric constant of a dielectric material inserted between the electrodes and an RF band to be used. In this way, passing the RF current through the RF interconnection 30 makes it possible to apply an RF magnetic field to the magnetic recording element (MTJ) to reverse the magnetization of the recording layer with a smaller current.

The operating principle of the write-in and read-out for the magnetic recording element will be explained below.

Figure 2A:
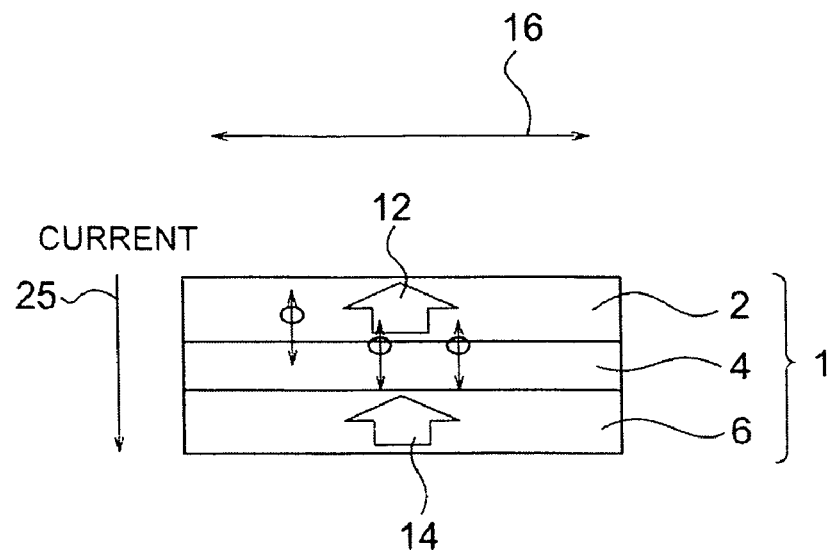
FIGS. 2A and 2B are schematic sectional views for explaining a mechanism of a "write-in" in a magnetic recording element.
Figure 2B:
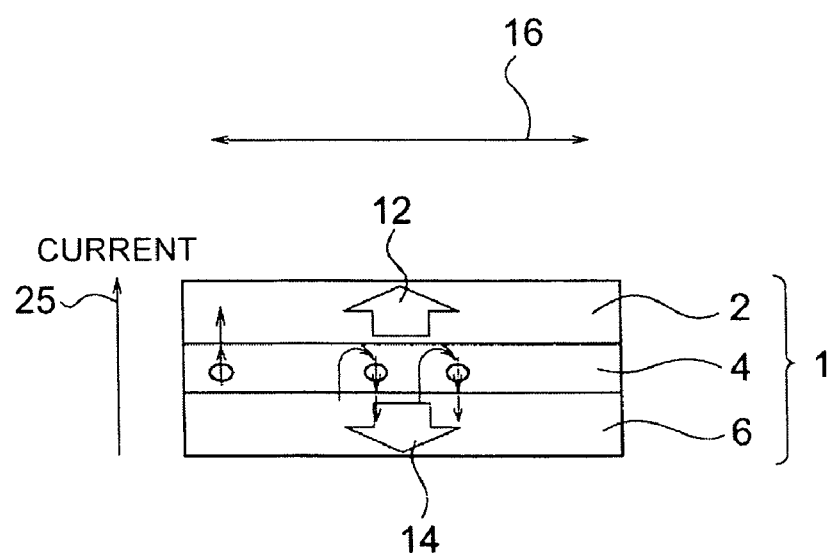

A fundamental mechanism of the "write-in" in the magnetic recording element is explained with reference to FIGS. 2A and 2B. FIGS. 2A and 2B show a typical sectional view. FIG. 2A shows a case in which an electron current 25, in a direction opposite to the usual current, is passed toward the magnetic recording layer 6 from the magnetic fixed layer 2, and FIG. 2B shows a case in which the electron current 25 is passed toward the magnetic fixed layer 2 from the magnetic recording layer 6.

The electron current 25 is passed so that the current passes over film surfaces of the magnetic fixed layer 2 and the write-in for the magnetic recording layer 6 is completed by the current. The write-in mechanism is explained more in detail as follows. A normal type magnetoresistive effect via the nonmagnetic barrier layer 4 is explained as a "normal type". The "normal type" corresponds to the case where a resistance of the magnetic recording element 1 becomes higher when magnetization of the magnetic fixed layer 2 and magnetization of the recording layer 6 on both sides of the nonmagnetic barrier layer 4 are anti-parallel than when they are parallel in the embodiment. In the normal type, a resistance between the magnetic fixed layer 2 and the magnetic recording layer 6 via the nonmagnetic barrier layer 4 becomes lower when the magnetization of the magnetic fixed layer 2 and the magnetization of the magnetic recording layer 6 are parallel than when they are anti-parallel.

In FIG. 2A, an electron which passes the magnetic fixed layer 2 having magnetization 12 whose direction is substantially perpendicular to the layer surface tends to have a spin of which direction is the same as the magnetization 12. The electron flows into the magnetic recording layer 6 to transmit the spin angular momentum to the magnetic recording layer 6, and acts on magnetization 14 of the magnetic recording layer 6. What is called "spin transfer torque" will act on the magnetization 14 of the magnetic recording layer 6. This will provide the magnetic recording layer 6 with the magnetization 14 of the same direction (upward in FIG. 2A) as the magnetization 12 of the magnetic fixed layer 2. Data "0" is assigned to the magnetic recording layer 6 which has the direction (upward in FIG. 2A) of the magnetization 14, for example. Data "0", i.e., is assigned when the magnetization of the magnetic recording layer 6 and the magnetization of the magnetic fixed layer 2 are parallel.

FIG. 2B shows the case where the direction of the electron current 25 is opposite, i.e., the case where the electron current 25 is passed toward the magnetic fixed layer 2 from the magnetic recording layer 6. Electrons pass through the nonmagnetic barrier layer 4 from the magnetic recording layer 6, and a portion of the electrons having a spin with the same direction (upward in FIG. 2B) as the magnetization 12 will pass through the magnetic fixed layer 2, while the other portion of the electrons having a spin with the direction (downward in FIG. 2B) opposite to the magnetization 12 will be reflected at an interface between the magnetic fixed layer 2 and the nonmagnetic barrier layer 4. The spin angular momentum of the reflected electron is transmitted to the magnetic recording layer 6, and acts on the magnetization 14. This makes the magnetic recording layer 6 tend to have the magnetization 14 with the direction (downward in FIG. 2B) opposite to the magnetization 12. What is called "spin transfer torque" will act on the magnetization of the magnetic recording layer 6. Data "1" is assigned to the magnetic recording layer 6 which has the magnetization 14 with the direction (downward in FIG. 2B), for example. Data "1" is assigned when the magnetization of the magnetic recording layer 6 and the magnetization of the magnetic fixed layer 2 are anti-parallel. In FIGS. 2A and 2B, the numeral 16 denotes the current magnetic field generated by the RF interconnection 30.

The magnetization direction of the magnetic recording layer 6 is determined by the above-mentioned actions, and data "0" and data "1" are suitably assigned in correspondence with the magnetization direction, and the "write-in" is thus completed in the magnetic recording element 1. In the above, the case where the magnetoresistive effects between the magnetic fixed layer 2 and the magnetic recording layer 6 via the nonmagnetic barrier layer 4 are of the "normal type" has been explained.

In a "reverse type case", the resistance becomes higher when the magnetization of the magnetic fixed layer 2 and the magnetization of the magnetic recording layer 6 on both sides of the nonmagnetic barrier layer 4 are parallel than when they are anti-parallel. The resistance between the magnetic fixed layer 2 and the magnetic recording layer 6 through the nonmagnetic barrier layer 4 becomes lower when the magnetization of the magnetic fixed layer 2 and the magnetization of the magnetic recording layer 6 are parallel than when they are anti-parallel. This will make electrons tend to have a spin with the direction opposite to the magnetization 12 after having passed through the magnetic fixed layer 2. Electrons having a spin with the same direction as magnetization 12 will be reflected, and electrons having a spin with the direction opposite to the magnetization 12 will pass through the magnetic fixed layer 2. The "write-in" mechanism of the "reverse type" is similar to that of the "normal type", a detailed explanation being omitted.

Figure 3A:
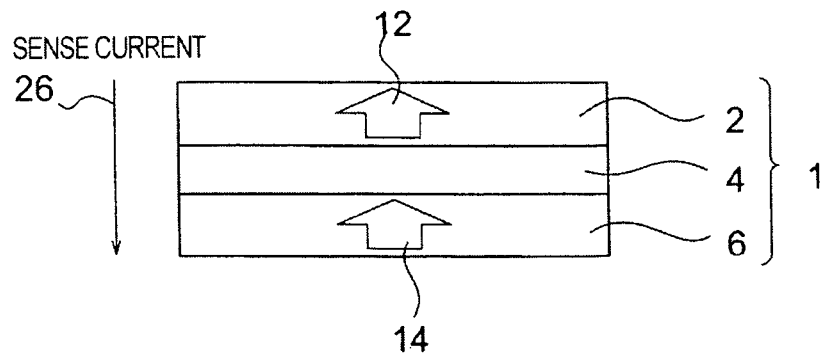
FIGS. 3A and 3B are schematic sectional views for explaining a mechanism of a "read-out" in a magnetic recording element.
Figure 3B:
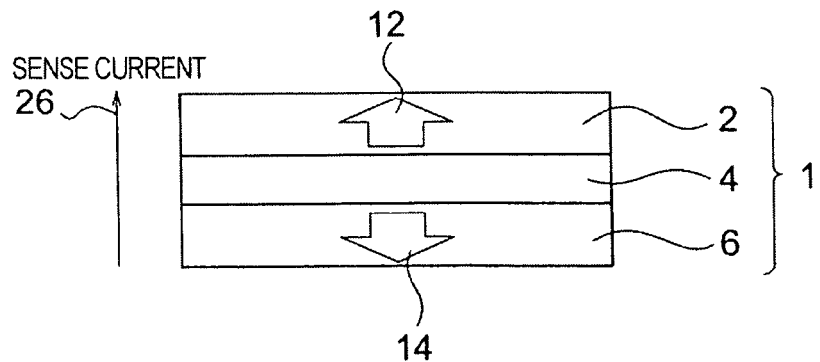

A mechanism of "read-out" in the magnetic recording element will be explained with reference to FIGS. 3A and 3B. FIGS. 3A and 3B are sectional views showing the cases where a sense current 26 for reading out data is passed when the magnetization 12 of the magnetic fixed layer 2 and the magnetization 14 of the magnetic recording layer 6 are parallel and anti-parallel, respectively.

In the magnetic recording element according to the embodiment, the direction of the magnetization 14 of the magnetic recording layer 6 can be detected using the "magnetoresistive effect" where a resistance varies according to a relative direction of the magnetization of each layer. When using the magnetoresistive effect, passing the sense current 26 between the magnetic fixed layer 2 and the magnetic recording layer 6 may provide a magnetoresistive measurement. A current value of the sense current 26 is smaller than that of the write-in current 25.

In the magnetic recording element shown in FIG. 3A, a magnetoresistance detected by the sense current 26 is relatively small in the normal type, and it is relatively large in the reverse type. On the contrary, in the magnetic recording element shown in FIG. 3A, the magnetoresistance detected by the sense current 26 is relatively large in the normal type, and it is relatively small in the reverse type. The write-in and read-out of binary data become possible by assigning data "0" and data "1" to these different magnetoresistances, respectively. The sense current 26 may be passed in a direction opposite to the arrow shown in FIG. 3B (a direction from the bottom to upper in the figure).

An operating principle of the magnetic memory of the first embodiment will be explained.

The write-in of the magnetic memory of the embodiment is explained. In the magnetic memory of the embodiment, when the electron current 25 is passed from the magnetic fixed layer 2 to the magnetic recording layer 6 (from bottom up in FIG. 1), the electrons passing through the magnetic fixed layer 2 tend to have a spin with the same direction as the magnetization 12 as mentioned above. This makes the magnetic recording layer 6 tend to have the magnetization 14 whose direction is the same as the magnetization 12. Simultaneously with the write-in, an RF current is passed through the RF interconnection 30. As a result, the RF interconnection 30 generates an RF magnetic field.

On the other hand, when the electron current 25 is passed from the magnetic recording layer 6 to the magnetic fixed layer 2 (in the top-to-bottom direction in FIG. 1), electrons having a spin with the direction opposite to the magnetization 12 are reflected at the interface between the magnetic fixed layer 2 and the nonmagnetic barrier layer 4. The electrons reflected in this way flow into the magnetic recording layer 6, the magnetic recording layer 6 tending to have the magnetization 14 whose direction is opposite (downward in the figure) to the magnetization 12 under an influence of the electron spin.

A frequency of the RF magnetic field generated by the RF interconnection 30 is about 1 GHz to 60 GHz, for example. The "RF magnetic field" will be referred to as the "RF field" in the detailed description of the invention. The direction of the RF field has a component parallel to the direction of the hard axis, i.e., perpendicular to the easy axis of the magnetic recording layer 6. Therefore, the RF field generated by the RF interconnection 30 is applied in the direction of the hard axis of the magnetic recording layer 6. Applying the RF field generated from the RF interconnection 30 in the direction of the hard axis of the magnetic recording layer 6 causes a magnetic resonance for the magnetization 14 of the magnetic recording layer 6 to ease the magnetization reversal remarkably.

The magnetization 14 of the magnetic recording layer 6, thus, becomes easy to reverse, making it possible to achieve a rapid magnetization reversal. Variations in magnetization reversals are reduced for the magnetization 14 of the magnetic recording layer 6. This enables it to make small the write-in current value.

According to the embodiment mentioned above, making the RF interconnection 30 and the magnetic recording layer 6 adjacent to each other, and making the RF interconnection 30 and the bit line 20 independent electrically enable it to determine a value of the current through the RF interconnection 30 independently of a value of the current through the bit line 20. Setting up the optimal intensity of the RF field makes higher the magnetization reversal efficiency of the magnetization 14 of the magnetic recording layer 6, and improves its controllability. The above-mentioned means brings about a speed-up and a reduction in the variations in the magnetization reversals without degradation of heat fluctuation tolerability and the magnetoresistive effect. It can also reduce the write-in current.

Figure 4:
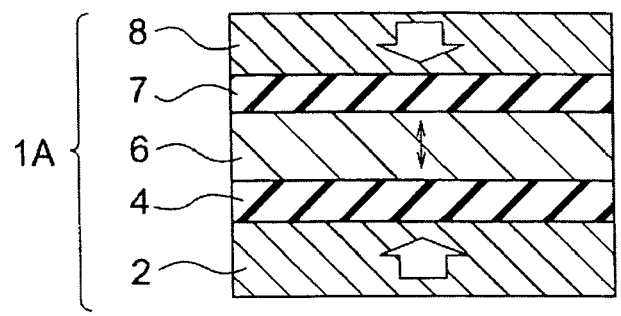
FIG. 4 is a schematic sectional view of a magnetic recording element with a dual-pin structure.

As shown in FIG. 1, the magnetic recording element 1 employed in the embodiment is provided with one magnetic fixed layer, while a magnetic recording element 1A with a structure shown in FIG. 4 may be employed. The magnetic recording element 1A is provided with a dual-pin structure which is further provided with a magnetic fixed layer 8 on a nonmagnetic barrier layer 7. In the magnetic recording element 1A, a critical reversal current for the magnetization reversal can be further lowered due to the dual-pin structure.

The magnetic recording element 1A with the dual-pin structure is provided with the structure of the magnetic fixed layer 2, the nonmagnetic barrier layer 4, the magnetic recording layer 6, the nonmagnetic barrier layer 7 and the magnetic fixed layer 8 laminated in this order. The magnetic fixed layer 2, the magnetic recording layer 6 and the magnetic fixed layer 8 comprise magnetic materials. Providing the magnetic fixed layers 7 and 8 with antiferromagnetic layers not shown in contact with them enables it to firmly fix magnetization of the magnetic fixed layers 7 and 8. The magnetic fixed layer 2, the magnetic recording layer 6 and the magnetic fixed layer 8 may be made essentially of a single magnetic film, while they may be a layered structure of magnetic films coupled with each other ferromagnetically or antiferromagnetically via a nonmagnetic film. For example, they may be a three-layer structure of a magnetic film/nonmagnetic film/magnetic film or a five-layer structure of a magnetic film/nonmagnetic film/magnetic film/nonmagnetic film/magnetic film.

The magnetization directions of the magnetic fixed layer 2 and magnetic fixed layer 8 are fixed so as to be anti-parallel mutually. The nonmagnetic barrier layers 4 and 7 consist essentially of a nonmagnetic material, and they have a certain film thickness so that they separate both the magnetic layers sandwiching the nonmagnetic layer. As a result, a direct interaction which acts between the two magnetic layers (between the magnetic recording layer 6 and the magnetic fixed layer 2, and between the magnetic recording layer 8 and the magnetic fixed layer 6) sandwiching the nonmagnetic layer can be negligibly small. When passing a current through the magnetic recording element 1A, it is also required that a spin direction of a conduction electron is not reversed during the whole time the conduction electron takes to pass through one magnetic layer (for example, the magnetic fixed layer 2) to the other magnetic layer (for example, the magnetic recording layer 6). It is, therefore, preferable that the nonmagnetic barrier layers 2 and 7 are thinner than a spin diffusion length. The same can be said for the nonmagnetic barrier layer 2 of the magnetic recording element 1 with a single-pin structure shown in FIG. 1.

Figure 5A:
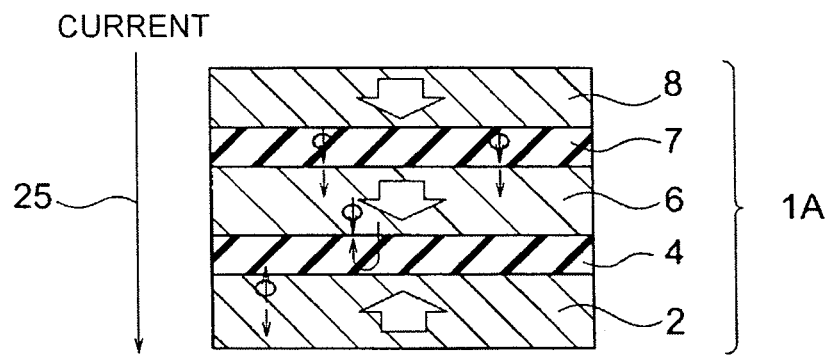
FIGS. 5A and 5B are views for explaining a mechanism of a "write-in" in a magnetic recording element with a dual-pin structure.
Figure 5B:
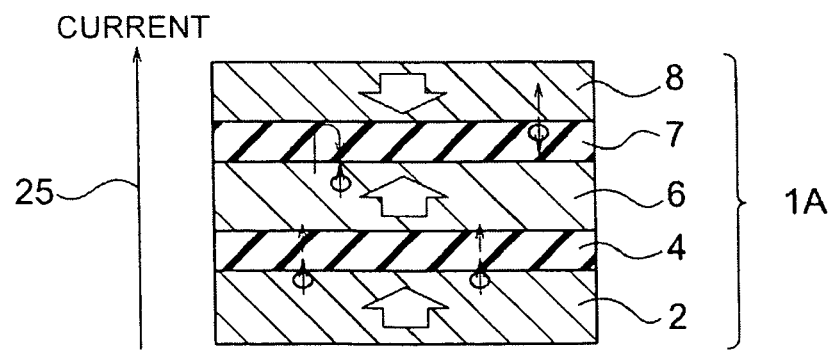

A write-in principle for the magnetic recording element 1A with the dual-pin structure will be explained with reference to FIGS. 5A and 5B. FIGS. 5A and 5B are sectional views for explaining the "write-in" mechanism for the magnetic recording element 1A with the dual-pin structure shown in FIG. 4. FIGS. 5A and 5B are sectional views showing magnetization directions for the case where the electron current 25 is passed from the magnetic fixed layer 8 toward the magnetic fixed layer 2 and vice versa, respectively.

Electrons having passed through the magnetic fixed layer 8 whose magnetization direction is substantially perpendicular to the layer surface in FIG. 5A tend to have a spin with the same direction as the magnetization of the magnetic fixed layer 8. Passing the electrons into the magnetic recording layer 6 via the nonmagnetic barrier layer 7 makes the electrons transmit their spin angular momenta to the magnetic recording layer 6, acting on the magnetization of the magnetic recording layer 6. On the other hand, referring to electrons having passed through the nonmagnetic barrier layer 4 and the magnetic recording layer 6, some electrons having a spin with the same direction as the magnetization 12 will pass through the magnetic fixed layer 2, while the other electrons having a spin with the direction opposite to the magnetization 12 will be reflected at the interface between the magnetic fixed layer 2 and the nonmagnetic barrier layer 4. The spin angular momenta of the reflected electrons are transmitted to the magnetic recording layer 6, and it acts on the magnetization of the magnetic recording layer 6. These two actions make the magnetic recording layer 6 tend to have the magnetization whose direction is the same as the magnetization of the magnetic fixed layer 8, i.e., the downward magnetization in FIG. 5A.

The electron having passed through the magnetic fixed layer whose magnetization direction is substantially perpendicular to the layer surface in FIG. 5B tends to have a spin with the same direction as the magnetic fixed layer 2. Passing the electron into the magnetic recording layer 6 via the nonmagnetic barrier layer 4 makes the electron transmit its spin angular momentum to the magnetic recording layer 6, acting on the magnetization thereof. On the other hand, referring to electrons having passed the nonmagnetic barrier layer 7 and the magnetic recording layer 6, some electrons having a spin with the same direction as the magnetization of the magnetic fixed layer 8 will pass through the magnetic fixed layer 8, while the other electrons having a spin with the direction opposite to the magnetization of the magnetic fixed layer 8 will be reflected at the interface between the magnetic fixed layer 8 and the nonmagnetic barrier layer 7. The angular momentum of the spin of the reflected electrons is transmitted to the magnetic recording layer 6, and it acts on the magnetization thereof. These two actions make the magnetic recording layer 6 have the magnetization whose direction is the same as the magnetization of the magnetic fixed layer 8, i.e., the upward magnetization in FIG. 5B.

The magnetic fixed layer 2 whose magnetization is fixed substantially perpendicularly to a surface of the layer 2 and the magnetic recording layer 6 whose magnetization is variable perpendicularly to a surface of the layer 6 have been employed for a magnetic fixed layer and a magnetic recording layer of the magnetic recording element of the embodiment. On the other hand, a magnetic fixed layer whose magnetization is fixed substantially parallel to a surface of the magnetic fixed layer and a magnetic recording layer whose magnetization is variable and parallel to a surface of the magnetic recording layer may be also employed. In the case, it is necessary to form the RF interconnection 30 so that an RF field generated by an RF current passing through the RF interconnection 30 may act in a hard axis direction of the magnetic recording layer. If the RF interconnection 30 is formed, e. g., so that it may be provided right above the magnetic recording element 1 and extends along the direction parallel to the easy axis of the magnetic recording layer 6, the RF field will act in the hard axis direction of the layer 6.

Each element which configures the magnetic recording element according to the embodiment will be explained in full detail.

A shape and material of the magnetic recording element of the first embodiment are explained.

For the magnetic fixed layer 2 or the magnetic recording layer 6 including a magnetic film whose magnetization is fixed substantially perpendicularly to the surface of the film 2 or 6, a material having a magnetic characteristic corresponding to the application purpose is appropriately selected from the following materials. For example, an alloy containing one or more elements selected from the group of iron (Fe), cobalt (Co), nickel (Ni), manganese (Mn) and chromium (Cr), and one or more elements selected from the group of Pt (platinum), Pd (palladium), Ir (iridium), ruthenium (Ru) and rhodium (Rh) may be used. It is possible to adjust characteristics of the magnetic fixed layer 2 and the magnetic recording layer 6 also by changing alloy composition or heat treatment for the ordered alloy. A binary alloy or artificial lattice film of CoCr, CoCrTa, FePt, FePtB, Fe/Pt, Co/Pd, Co/Pt or so may be used.

A composite material with magnetic particulates precipitated in a nonmagnetic matrix or with magnetic particulates covered by a nonmagnetic material, as well as a continuous magnetic material, is employable for the magnetic fixed layer 2 or the magnetic recording layer 6. The composite material includes what is called a "granular magnetic material" or "core-shell structure." Composite structures containing magnetic particulates are suitable for miniaturization of magnetic recording elements and also for high-density memory technology. A shape of the magnetic particulates is cylindrical or globular. When the nonmagnetic matrices are high-resistance oxide materials such as $Al_2O_{3-x}$, $MgO_{1-x}$, $SiO_x$, $ZnO_x$, and $TiO_x$, the low density write-in current is achievable for a magnetization reversal, because a spin-polarized electron current concentrates to the magnetic particulates to be conductive. Using the same nonmagnetic material as a barrier layer makes it easy to control crystallinity and magnetic anisotropy of the particulates in the composite structures.

The magnetic fixed layer 2 or the magnetic recording layer 6 including a magnetic film whose magnetization is fixed substantially parallel to the film surface comprises one or more magnetic elements selected from the group of iron (Fe), cobalt (Co), nickel (Ni), manganese (Mn) and chromium (Cr).

It is, however, preferable that a magnetic anisotropy constant $K_u$ of the magnetic recording layer 6 satisfies the following inequation from the view point of record retention for both cases where the easy axis is substantially perpendicular and parallel to the layer surface.

$$K_u \cdot V/(k_B \cdot T) > 30$$

The above inequation shows how much a direction of the magnetization can be resistant to heat fluctuations. The grounds for the lower limit 30 are based on a value which has a sufficient margin for ambient temperatures at which the magnetic memory operates. A criterion of the inequation has not been defined by $K_u$ only. This is because a whole volume of the magnetic recording layer 6 also influences heat fluctuations of the magnetization. The numerical value in the above-described criterion is an index for perpendicular magnetization films. Here, V, $k_B$ and T express the magnetic volume of the magnetic recording layer 6, a Boltzmann constant, and the ambient temperature of the magnetic recording layer 6, respectively.

A ferrimagnetically layered film may be employed for the magnetic fixed layer 2 or the magnetic recording layer 6. This is because the magnetization of the magnetic fixed layer 2 is fixed efficiently due to a ferrimagnetic structure. A layered structure of two or more different magnetic films may be employed to improve magnetic characteristics. Another layered structure may comprise a perpendicularly magnetizable film and an in-plane magnetizable film which are laminated.

The magnetic recording layer 6 preferably has a thickness ranging from 1 nm to 15 nm (not including a thickness of a nonmagnetic film in the case of a layered structure). When the magnetic recording layer 6 is thinner than about 1 nm, the layer has deteriorated characteristics. When the magnetic recording layer 6 is thicker than about 15 nm, the layer needs a reversal current more for the magnetization reversal to be caused.

An insulating material may be employed as a tunnel barrier layer for the nonmagnetic barrier layer 4 to reproduce a large signal output according to a TMR effect (Tunneling Magnetoresistive effect) at the time of read-out. As a material for the nonmagnetic barrier layer 4, specifically an insulator comprising an oxide, a nitride, or a fluoride including one or more element selected from the group consisting of Aluminum (Al), titanium (Ti), tantalum (Ta), cobalt (Co), nickel (Ni), silicon (Si), and iron (Fe) can be used.

A preferable material for the nonmagnetic barrier layer 4 is an insulator or a semiconductor with a large energy gap in particular such as magnesium oxide (MgO), $SiO_{2-x}$, Si—O—N, Ta—O, Al—Zr—O, ZnOx, TiOx and GaAlAs etc. The nonmagnetic barrier layer is made from what is called a "nano contact" MR material with pinholes filled by magnetic materials or what is called a "CCP (Confined Current Pass)-CPP (Current Perpendicular to Plane)" MR material with Cu-filled pinholes formed in the material. The nonmagnetic barrier layer yields a large reproduction signal output.

When the nonmagnetic barrier layer 4 is a tunnel barrier layer, it is preferable to make the thickness in a range of 0.2-2.0 nm in order to obtain a large reproduction signal output. Similarly, when the nonmagnetic barrier layer is made essentially of the nano contact MR material, it is preferable to make the thickness in a range of 0.4-40 nm in order to obtain a large reproduction signal output.

A sectional shape taken substantially parallel to a film surface of the magnetic recording element 1 in the magnetic memory shown in FIG. 1 has the same dimension for each layer (lateral dimension in FIG. 1). The shape is not limited to the above-mentioned, but may be made for the size of each layer to differ mutually in order to control each magnetization direction or to interconnect. The shape may be a trapezoid where a sectional dimension (lateral dimension in FIG. 1) taken substantially parallel to the film surface tapers from the bottom to top layer or a convex where a sectional dimension (lateral dimension in FIG. 1) taken substantially parallel to the film surface tapers from the bottom to top layer discontinuously. Even in such a case, the same effect as the embodiment can be acquired.

The sectional shape of the magnetic recording element 1 according to the embodiment should preferably have an aspect ratio of about 1 to 10 for the magnetic recording layer 6 in the perpendicular magnetization mode where an easy axis of the magnetization orients substantially perpendicularly to the film surface. It is preferable that the short axis is, e.g., in a range of about 5 nm to 300 nm concerning the planer shape of the magnetic recording layer. The magnetic recording layer 6 with a planer shape such as a rectangle, elongated hexagon, ellipse, lozenge and parallelogram should preferably have an aspect ratio of about 1.2 to 5 for the magnetic recording layer 6 in the in-plane magnetization mode where an easy axis of the magnetization lies substantially parallel to the film surface.

Either one of the following materials or an alloy containing at least one of them is appropriately selected for the RF interconnection 30. For example, gold (Au), copper (Cu), chromium (Cr), zinc (Zn), garium (Ga), niobium (Nb), molybdenum (Mo), ruthenium (Ru), palladium (Pd), silver (Ag), hafnium (Hf), tantalum (Ta), tungsten (W), platinum (Pt), bismuth (Bi) may be used.

A simulation for magnetization reversals (spin-polarized current direct driving magnetization reversal assisted by a resonant excitation) will be explained on the magnetic recording layer 6 of the magnetic recording element of the embodiment.

Figure 6:
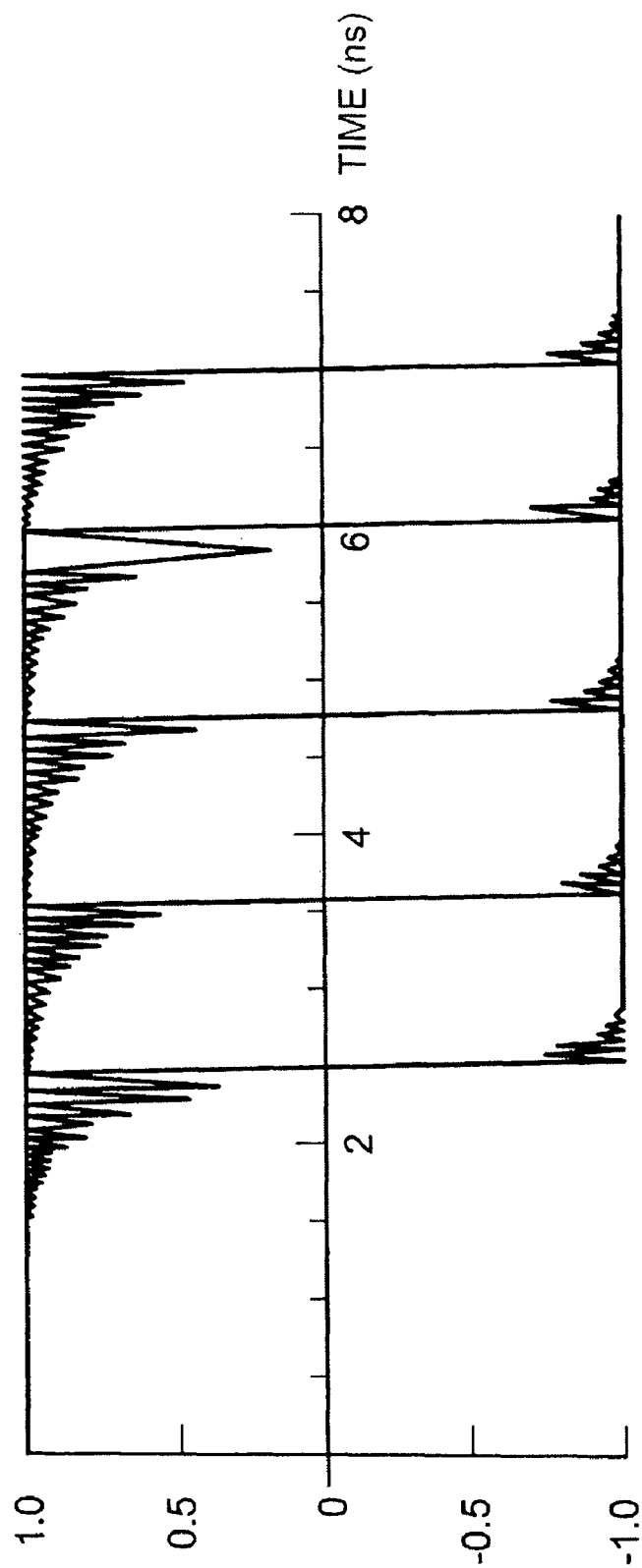
FIG. 6 is a graph showing a change in a magnetization reversal with time in the case that a write-in is performed without applying a radio-frequency (RF) current-induced magnetic field to a magnetic recording layer.
Figure 7:
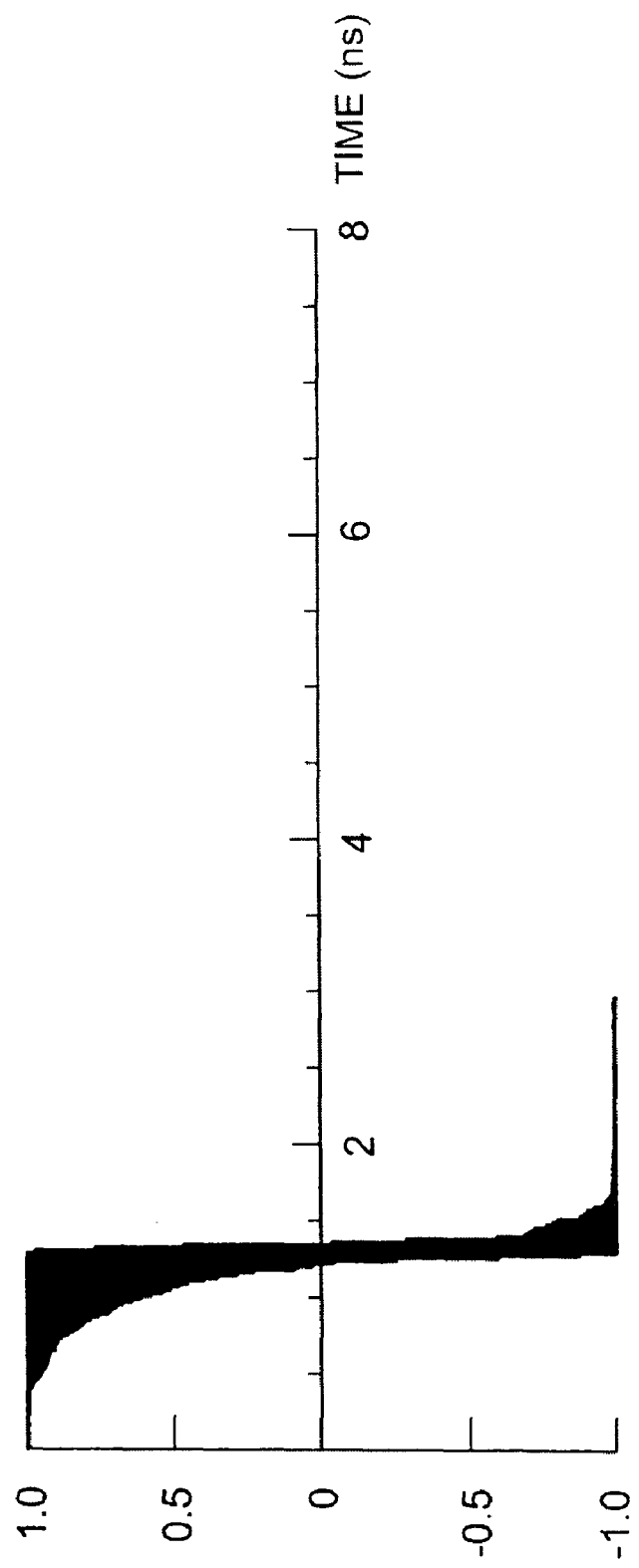
FIG. 7 is a graph showing a change in a magnetization reversal with time in the case that a write-in is performed with applying an RF magnetic field to a magnetic recording layer.

FIG. 6 is a graph exemplifying a time change in the magnetization reversal when the write-in is executed without applying the RF field to the magnetic recording layer 6. FIG. 7 is a graph exemplifying a time change in the magnetization reversal when the write-in is executed with applying the RF field to the magnetic recording layer 6. FIGS. 8A to 8E are graphs showing a time change in the magnetization reversal when the write-in is executed with applying various RF fields with different frequencies to the magnetic recording layer 6, corresponding to the cases of 0.1 GHz, 2 GHz, 4 GHz, 10 GHz and 15 GHz in frequency, respectively. The horizontal axis of FIGS. 6 to 8E represents the time taken from passing the write-in current until the completion of the magnetization reversal. The vertical axis of FIGS. 6 to 8E represents the magnetization directions of the magnetic recording layer. It means that the magnetization reversal has completed when the value of the vertical axis changes from 1.0 to −1.0.

The simulation is carried out on the basis of the Landau-Lifshitz-Gilbert equation incorporating the term of the spin transfer torque shown in the following equation. In the following equation, M denotes a vector of the magnetization 14 of the magnetic recording layer 6, and m and $m_{pin}$ denote unit vectors of the magnetization 14 of the magnetic recording layer 6 and the magnetization 12 of the magnetic fixed layer 2, respectively. $H_{eff}$ denotes an effective field applied to the magnetic recording layer 6, and an effect of the RF field applied is added to $H_{eff}$. $\gamma$, $\alpha$, I, e and g denote a spin-polarization rate, damping constant, current, elementary electric charge and spin-torque transfer efficiency, respectively.

$$dM/dt = -\gamma M \times H_{eff} + \alpha m \times (dM/dt) + (I/e) g m \times (m_{pin} \times m)$$ [Equation 1]

A basic structure of the magnetic recording element 1 in the simulation is assumed to be the magnetic recording layer 6/the nonmagnetic barrier layer 4/the magnetic fixed layer 2. The magnetic recording layer 6 is assumed to be a 2.5-nm thick Co, and the magnetic fixed layer 2 is assumed to be a 40-nm thick Co. The magnetic recording layer 6 is assumed to be an ellipse of which major and minor axes are about 120 nm and 90 nm, respectively. An easy axis direction of the magnetic recording layer 6 is substantially parallel to the layer surface and in particular to the direction of the major axis of the ellipse. An anisotropy field is assumed to be 150 Oe (Oersted) typically. These parameters have been selected based on the inventors' preliminary experiments.

A critical reversal current density $J_c$ is calculated to be $2 \times 10^7$ A/cm$^2$ in the magnetic recording element. However, the critical reversal current density $J_c$ is a current value required for the magnetization reversal when a quasistatic current is passed. Shortening the current pulse requires the reversal current density not less than several times the critical reversal current density $J_c$.

In the simulation shown in FIG. 6, a DC current corresponding to a current density of 2.86 times the critical reversal current density $J_c$ was passed to the magnetic recording layer 6 for the magnetization reversal (write-in), without applying an RF field. FIG. 6 includes two or more curves. This is because the figure shows results in piles for various initial angles of the magnetization 14 of the magnetic recording layer 6. An initial angle of the magnetization 14 of the magnetic recording layer 6 ranges up to a maximum angle of 0.57 degrees with respect to the easy axis direction. Although a current corresponding to a current density of 2.86 times the critical reversal current density $J_c$ is passed perpendicularly to the magnetic recording element, it can be seen that the reversal time differs depending on the initial angles of the magnetization 14 of the magnetic recording layer 6. This yields a reversal probability of about ½ when the write-in current has a pulse width of, e.g., about 5 ns. The simulation shows that a larger write-in current is required in order for a pulse width of about 5 ns to yield a reversal probability of 1 without applying an RF field to the magnetic recording layer 6.

In the simulation shown in FIG. 7, the magnetization reversal is performed in the same way as the simulation shown in FIG. 6. A DC current corresponding to a current density of 2.86 times the critical reversal current density $J_c$ is passed mainly for the magnetization reversal (write-in). An RF field is applied subsidiarily to the hard axis direction of the magnetic recording layer 6 simultaneously with passing the DC current. The RF field has a frequency of 4.75 GHz and amplitude of 30 Oe. The initial angle of the magnetization 14 of the magnetic recording layer 6 is set to range up to a maximum angle of 0.57 degrees with respect to the easy axis direction in the same way as the simulation shown in FIG. 6. The results are shown also in piles for the various initial angles. In contrast to the simulation shown in FIG. 6, the RF field applied to the magnetic recording layer 6 yields a magnetization reversal time of 1.3 ns, independently of the initial angles. This shows that a rapid magnetization reversal has become possible without variations, meaning the possibility to reduce a current density for the magnetization reversal.

Figure 8A:
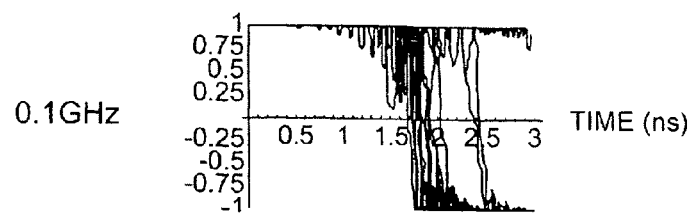
FIGS. 8A-8E are graphs showing a change in a magnetization reversal with time in the case that a write-in is performed with applying an RF magnetic field with various frequencies to a magnetic recording layer.
Figure 8B:
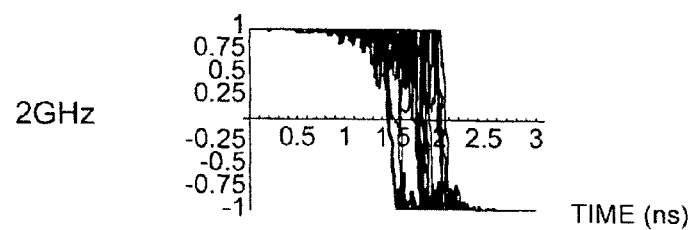
Figure 8C:
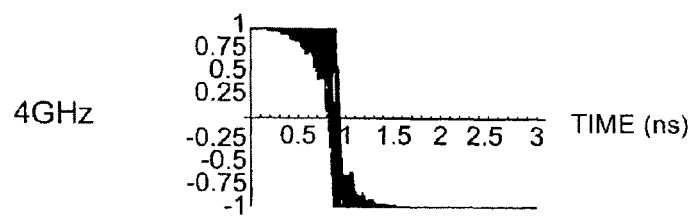
Figure 8D:
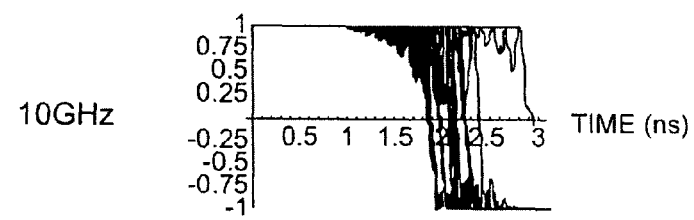
Figure 8E:
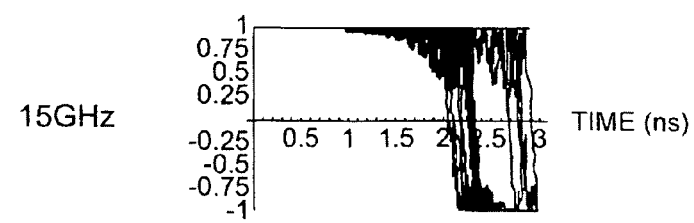

In the simulation shown in FIGS. 8A to 8E, the magnetization reversal is performed in the same way as the simulation shown in FIG. 7. A DC current corresponding to a current density of 2.86 times the critical reversal current density $J_c$ is passed mainly for the magnetization reversal (write-in). However, an RF field is subsidiarily applied to the hard axis direction of the magnetic recording layer 6 simultaneously with passing the DC current. The RF field has amplitude of 30 Oe. The simulation shows that the initial angle of the magnetization 14 of the recording layer changes the reversal time in any cases that the RF field has a frequency of 0.1 GHz, 2 GHz, 10 GHz and 15 GHz (shown in FIGS. 8A, 8B, 8D and 8E). On the other hand, as shown in FIG. 8C, it can be seen clearly that the reversal time does not depend on the initial angle of the magnetization 14 of the magnetic recording layer 6 to be about 0.9 ns when the RF field has a frequency of 4 GHz. That is, a frequency of, e.g., about 4 GHz is preferred as a condition for a rapid magnetization reversal with less variations so that the magnetic recording layer 6 may cause a magnetic resonance. Evaluating RF responses (transmissivity and reflectance) of the magnetic recording element 1 by means of a network analyzer connecting to the element can confirm a frequency for the magnetic resonance of the element.

Figure 9:
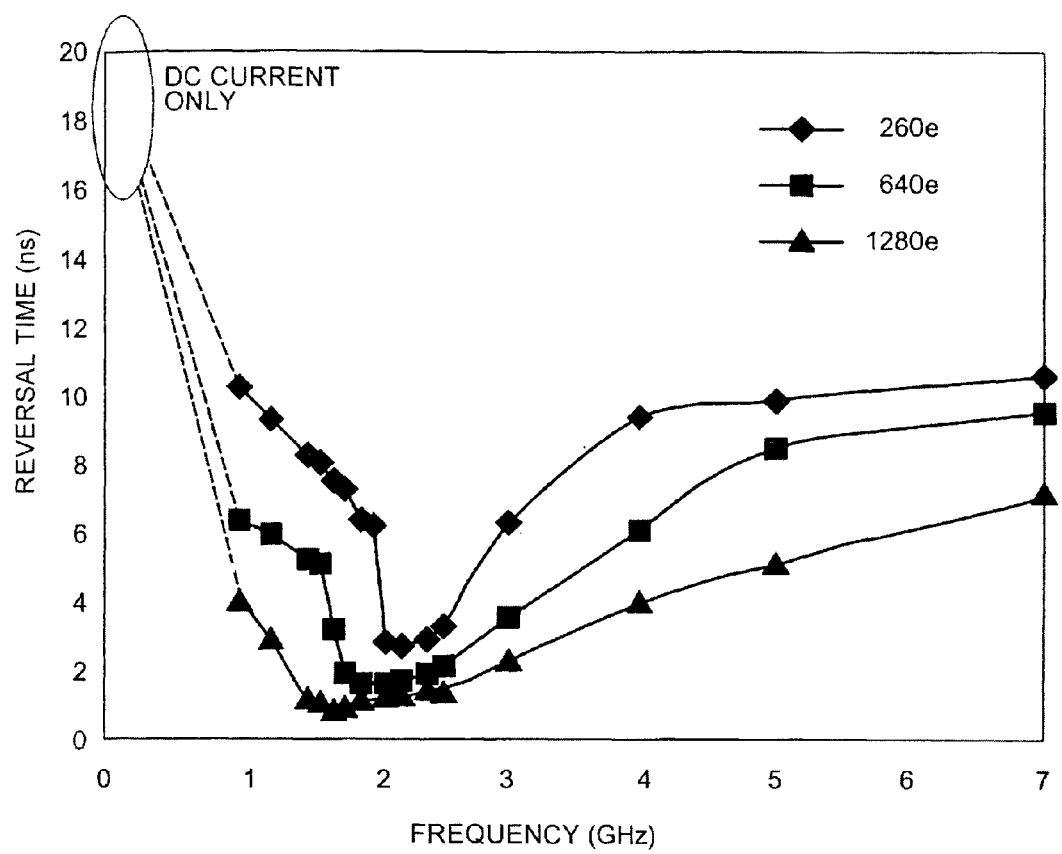
FIG. 9 is a graph showing a simulation on frequency dependence of a magnetization reversal time with an RF magnetic field intensities as parameters in the case that a write-in is performed with applying RF magnetic fields with various frequencies to a magnetic recording layer.

A simulation of the magnetic recording layer 6 whose magnetization is substantially perpendicular to the layer surface will be explained with reference to FIG. 9. FIG. 9 shows the simulation of the frequency and field-intensity dependence of the reversal time for the write-in with the RF field applied subsidiarily to the magnetic recording layer 6. The numeric values have been assumed to be $6.2 \times 10^6$ erg/cc and 970 emu/cc as a perpendicular anisotropy constant $K_u$ and a saturation magnetization $M_s$ of the magnetic recording layer 6, respectively. The case yields an anisotropy field $H_k$ of 12.8 kOe and a critical reversal DC-current density $J_c$ of $1.69 \times 10^6$ A/cm$^2$.

The basic structure of the magnetic recording element 1 is assumed to be a layered structure of the magnetic recording layer 6/the nonmagnetic barrier layer 4/the magnetic fixed layer 2, the same as that in the simulation shown in FIGS. 6 to 8E. Specifically, FeXY/MgO/FeXY is assumed. The magnetic recording layer 6 and the magnetic fixed layer 2 comprise FeXY, and the nonmagnetic barrier layer 4 comprises MgO. Here, X is at least one element chosen from the group of chromium (Cr), copper (Cu), cobalt (Co), nickel (nickel), vanadium (V). Y is platinum (Pt) or palladium (Pd). Inserting an interface layer of FeX into the interface between the magnetic recording layer 6 of FeXY and the nonmagnetic barrier layer 4 of MgO or between the nonmagnetic barrier layer 4 of MgO and the magnetic fixed layer 2 of FeXY may furthermore intensify the TMR effect.

The RF field with a frequency of 1 GHz to 7 GHz has been applied parallel to the film surface to be of the hard axis direction, and the magnetization reversal has been investigated on the magnetic recording element 1. The intensity of the RF field has been changed to be 26 Oe, 64 Oe and 128 Oe. The magnetization reversal (write-in) is performed with a current corresponding to a current density of 1.64 times the critical reversal current density $J_c$. The reversal time changes depending on the initial angle of the magnetization 14 of the magnetic recording layer 6, while FIG. 9 shows a result that the longest reversal time is plotted with respect to the frequency of the RF field in the same way as the simulation shown in FIGS. 6 to 8E. The time of the magnetization reversal without the RF field is shown near the zero frequency on the horizontal axis in FIG. 9. Applying no RF field causes a long reversal time of about 20 ns. A current corresponding to, e.g., a density of $2.77 \times 10^6$ A/cm$^2$ and having a pulse-width of 8 ns cannot cause the magnetization reversal (write-in) without applying the RF field. However, it is seen that the magnetization reversal can be achieved 100% by means of subsidiarily applying the 2.2-GHz RF field with intensity of 0.2% to 1% of the anisotropy field $H_k$. It is also seen that even if the RF field has sufficient intensity, a deviation of its frequency from the resonant frequency causes an incomplete magnetization reversal.

In both cases of the in-plane and perpendicular magnetization modes for the magnetization 14 of the magnetic recording layer 6, subsidiarily applying the RF field with the resonant frequency for the magnetic recording layer 6 in the direction of its hard axis makes it possible to achieve the rapid magnetization reversal with less variations, leading to a substantial reduction in the write-in current density.

A simulation on RF transmissivity of the magnetic memory of the embodiment will be explained with reference to FIGS. 10 and 11A-11C.

Figure 10:
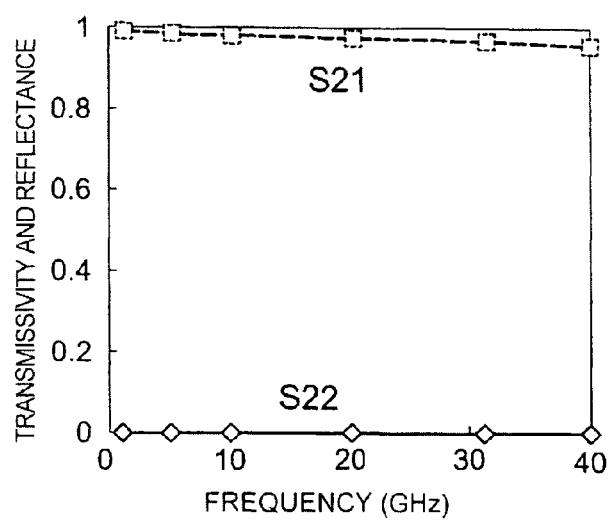
FIG. 10 is a graph showing a simulation on a change in transmissivity and reflectance of a magnetic memory with frequency according to an example.
Figure 11A:
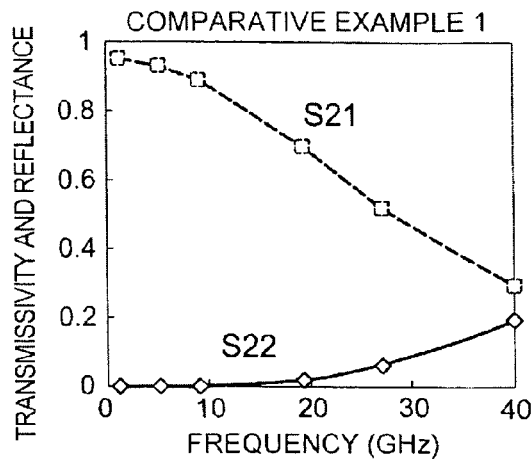
FIGS. 11A-11C are graphs showing a simulation on a change in transmissivity and reflectance of a magnetic memory with frequency according to a comparative example.
Figure 11B:
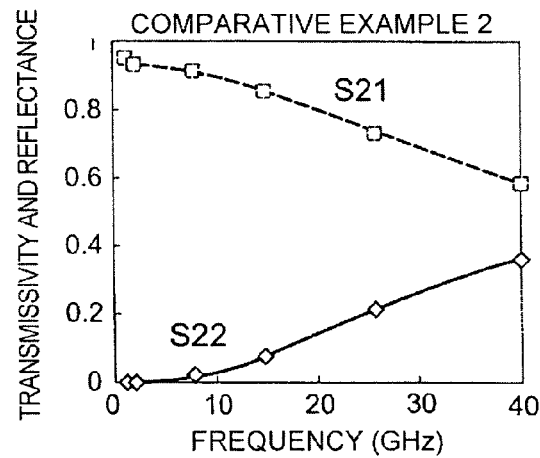
Figure 11C:
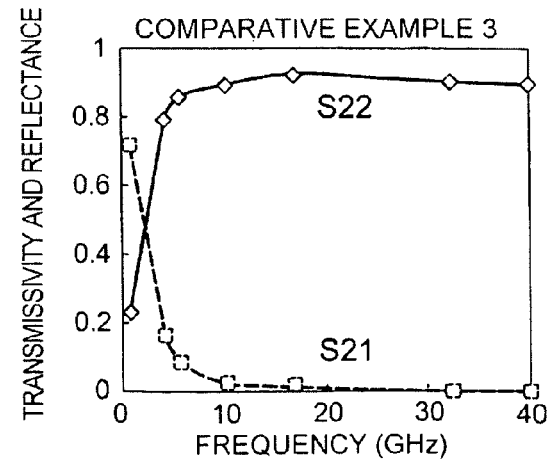

FIGS. 10 and 11A-11C are graphs showing simulations of frequency dependence of the transmissivity S21 and reflectance S11 when an RF current is passed through the RF interconnection in the system where the interconnection is intersected perpendicularly with the bit line. FIG. 10 is a graph showing the simulation on the magnetic memory of the embodiment. An RF current is passed through the RF interconnection 30 which is provided so that the ground line 35 is provided across a dielectric layer right above the interconnection 30, and the lines 35 and 30 are parallel to each other. FIG. 11A is a graph showing the simulation for the magnetic memory of a comparative example 1, i.e., a result simulated when an RF current is passed through a single RF interconnection. FIG. 11B is a graph showing a simulation for the magnetic memory of a comparative example 2, i.e., a result simulated when a ground line is additionally provided parallel to an RF interconnection on the side opposite to the magnetic recording element 1. FIG. 11C is a graph showing a simulation for the magnetic memory of a comparative example 3, i.e., a result simulated when a ground line is provided right above an RF interconnection across a dielectric layer with a gap spacing d (refer to FIG. 1) smaller than that of the embodiment, and an RF current is passed through the RF interconnection.

The horizontal axis of FIGS. 10 and 11A-11C represents the frequency of the RF current passed through the RF interconnection, and the vertical axis represents the transmissivity S21 and reflectance S22 for the RF current passed through the interconnection.

In the embodiment and the comparative example 3 corresponding to the results shown in FIGS. 10 and 11C, the RF interconnections used for the above simulations are assumed to measure 0.5 µm high (H1) by 1 µm wide (W1). In the comparative examples 1 and 2 corresponding to the results shown in FIGS. 11A and 11B, the RF interconnections are assumed to measure 0.5 µm high (H1) by 10 µm wide (W1). The ground line is assumed to measure 1 µm wide (W2) by 5 µm high (H2) in the embodiment corresponding to the result shown in FIG. 10. The gap d between the ground line and the RF interconnection is assumed to be 0.1 µm in the embodiment. In the comparative examples 1 and 2 corresponding to the results shown in FIGS. 11A and 11B, the ground lines are assumed to measure 0.5 µm high (H2) by 15 µm wide (W2), and the gap d between the ground line and the RF interconnection is assumed to be 5 µm. In the comparative examples 1 and 2 corresponding to the result shown in FIG. 11C, the ground line is assumed to measure 5 µm high (H2) by 10 µm wide (W2), and the gap d between the ground line and the RF interconnection is assumed to be 0.05 µm. A material of the RF interconnection and the ground line is assumed to be gold (Au). The above-mentioned parameters have been selected based on the inventors' preliminary experimental results.

As seen in the simulation shown in FIG. 10 on the embodiment, the transmissivity S21 and reflectance S22 reach up to 96% and down to 3%, respectively, at 40 GHz, showing structures of the embodiment capable of passing the RF current.

On the other hand, as seen in the simulation for the comparative example 1 shown in FIG. 11A, the transmissivity S21 decreases down to 29% and the reflectance S22 increases up to 19%, indicating that a single bit line is not capable of passing the RF current without an RF interconnection.

In the simulation of the comparative example 2 shown in FIG. 11B, the transmissivity S21 and the reflectance S22 go down to 59% and up to 37% at 40 GHz, respectively. Providing the ground line improves the transmissivity S21 in comparison with the comparative example 1. However, the reflectance S22 also increases because of an increase in an overlap area between the bit line and the ground line in addition to an overlap area between the bit line and the RF interconnection.

As seen in the simulation shown in FIG. 11C on the comparative example 3, the transmissivity S21 and reflectance S22 go further down to 0.5% and up to 88% at 40 GHz, respectively, showing that the gap provided too small in comparison with the interconnection width has an adverse effect.

Combining all the results mentioned above yields two points to raise the RF transmissivity. The first point is to make the ground line neighbor to the RF interconnection and to make as small an overlap area as possible between the RF interconnection and other interconnection facing the RF interconnection, i.e., the bit line in the embodiment, except the ground line. This is because the RF current does not transmit directly through the inside of the RF interconnection like a DC current, but transmits through a specific skin depth of the RF interconnection, due to a skin effect, with radiating electric flux lines. The second point is, therefore, to confine electric energy of the RF current spatially between the RF interconnection and the ground line provided additionally in order to transmit the RF current. In other word, it is important to suppress spatial spreads of electric flux lines between the RF interconnection and the ground line. Note the simulation on the comparative example 3. Merely providing a ground line alongside of the RF interconnection without careful considerations often causes a loss of the RF current as seen in the result on the comparative example 3 shown in FIG. 11C. Passing the RF current through the RF interconnection requires several special conditions to be met.

The above-mentioned two points lead to the following important result. That is, providing the ground line 35 right above the RF interconnection 30 and making as small the area as possible of the RF interconnection 30 facing the bit line 20 enables the RF current to transmit efficiently.

EXAMPLE

This embodiment will be explained more in detail with reference to an example.

In the example, the magnetic memory with the same structure as shown in FIG. 1 has been actually made (the sample number S1). The magnetic recording element of the magnetic memory is provided with the following materials and layer thicknesses. First, the magnetic fixed layer 2 is formed on the antiferromagnetic layer (not shown) consisting essentially of IrMn, and has the layered structure comprising a 1-nm thick CoFeB film/a 1-nm thick Ru film/a 4-nm thick CoFe film. The nonmagnetic barrier layer 4 comprises a 1 nm-thick MgO film. The magnetic recording layer 6 has the layered structure of a 1 nm-thick CoFe film and a 1 nm-thick CoFeB film. A CoFe film is provided at the side of the nonmagnetic barrier layer 4. The RF interconnection 30 is provided across a 0.06 µm-thick SiO$_2$ layer above the bit line 20. The RF interconnection 30 comprises a 1-µm thick gold, and its cross-section measures 1 µm wide (W1) by 1 µm high (H1). The ground line 35 is provided across a 0.1 µm-thick SiO$_2$ layer (d) above the RF interconnection 30, and comprises Au to cross-sectionally measure 0.5 µm wide (W2) by 3 µm high (H2).

The samples (the sample numbers R1 and R2) for the comparative examples 1 and 2 have been experimentally made, respectively. The sample R1 is provided only with the RF interconnection right above the magnetic recording element (MTJ). The sample R2 is provided with the ground line further added parallel to the RF interconnection of the sample R1. That is, the sample R2 is provided with the ground line and the RF interconnection. Therefore, three different kinds of samples have been made in total.

These samples are made in the following procedure.

After forming a lower electrode (an extraction electrode) 40 on a wafer, the wafer is set in a chamber of an ultrahigh-vacuum sputtering apparatus. The antiferromagnetic layer not shown, the magnetic fixed layer 2, the nonmagnetic barrier layer 4, the magnetic recording layer 6 and the cap layer not shown are sequentially laminated in this order on the lower electrode (the extraction electrode) at room temperature. Au (001) or Pt (001) buffer layer, e.g., can be used for the lower electrode 40. However, after forming the nonmagnetic barrier layer 4, post-annealing is performed at 300 degrees centigrade. The wafer is preliminarily annealed in a vacuum furnace in a magnetic field at 270 degrees centigrade for 2 hours to provide the antiferromagnetic layer with an exchange bias function.

EB (electron beam) resist is coated, and then EB exposure is performed to form a mask. The mask is made into an ellipse of 70 nm×140 nm, and its longitudinal direction along the major axis is parallel to the magnetic anisotropy direction of the magnetic recording layer 6, for example. And then the cap layer not shown, the magnetic recording layer 6, the nonmagnetic barrier layer 4, the magnetic fixed layer 2 and the antiferromagnetic layer not shown in the area not covered by the mask are etched by means of ion milling. Here, the etching amount can be evaluated precisely using a mass analyzer that takes sputtered particles into the quadrupole analyzer to perform a mass-spectroscopy analysis.

Then, after forming the SiO$_2$ film with the same thickness as the etched depth on the layered structure of the cap layer not shown, the magnetic recording layer 6, the nonmagnetic barrier layer 4, the magnetic fixed layer 2 and the antiferromagnetic layer not shown, the surface of the wafer etched in the above-mentioned way is flattened by removing the mask to form the upper electrode 20 (the bit line) on the cap layer not shown.

An SiO$_2$ film is formed to electrically insulate the bit line 20 from the RF interconnection 30, and then a film for the RF interconnection layer is further laminated on the SiO$_2$ film to pattern the RF interconnection layer with the optical lithography. Subsequently, another SiO$_2$ film and Au film for the ground line 35 are laminated in this order to form the ground line 35 in the same process as mentioned above. The ground line 35 is formed above the RF interconnection 30 in the sample S1 of the example. On the other hand, the ground line 35 is not formed in the sample R1 of the comparative example 1, but the ground line 35 is formed not above but beside the RF interconnection 30 in the sample R2 of the comparative example 2.

First of all, a network analyzer was connected with the RF interconnection of the sample thus made to evaluate the RF response (transmissivity or reflectance). The result obtained here reflects the simulations described above, yielding the following order as to the transmissivity.

The sample S1 of the example>the sample R2 of the comparative example 2>the sample R1 of the comparative example 1

As a result, the sample R1 of the comparative example 1 in particular did not pass the RF current at 40 GHz at all. The write-in was tested 50 times with a 2-nsec pulse current passed through. Every time the write-in test was performed, the 40-GHz RF current was passed through the RF interconnection. The write-in probability was evaluated as 1 and 0 for the sample S1 of the example and the sample R1 of the comparative example 1, respectively. The write-in was achieved for the sample R2 of the comparative example 2 with a specific value of the 40-GHz RF current. Such an RF current simultaneously almost caused electronic migrations of the RF interconnection, breaking down the RF interconnection of the sample R2 before completing the 50-time repetitions. For comparison, the cross-section and the specific value of the break-down current were clarified to be 1.5 µm$^2$ and 30 mA, respectively. As is clearly seen from the above-mentioned result, the rapid magnetization reversal may be performed without variations according to the magnetic memory of the example to possibly lower the reversal current. The same performance as the above was acquired when one of Al$_2$O$_{3-X}$, SiO$_{2-X}$, TiO$_X$, and ZnO$_X$ was used for the nonmagnetic barrier layer 4.

First Modified Example

Figure 12:
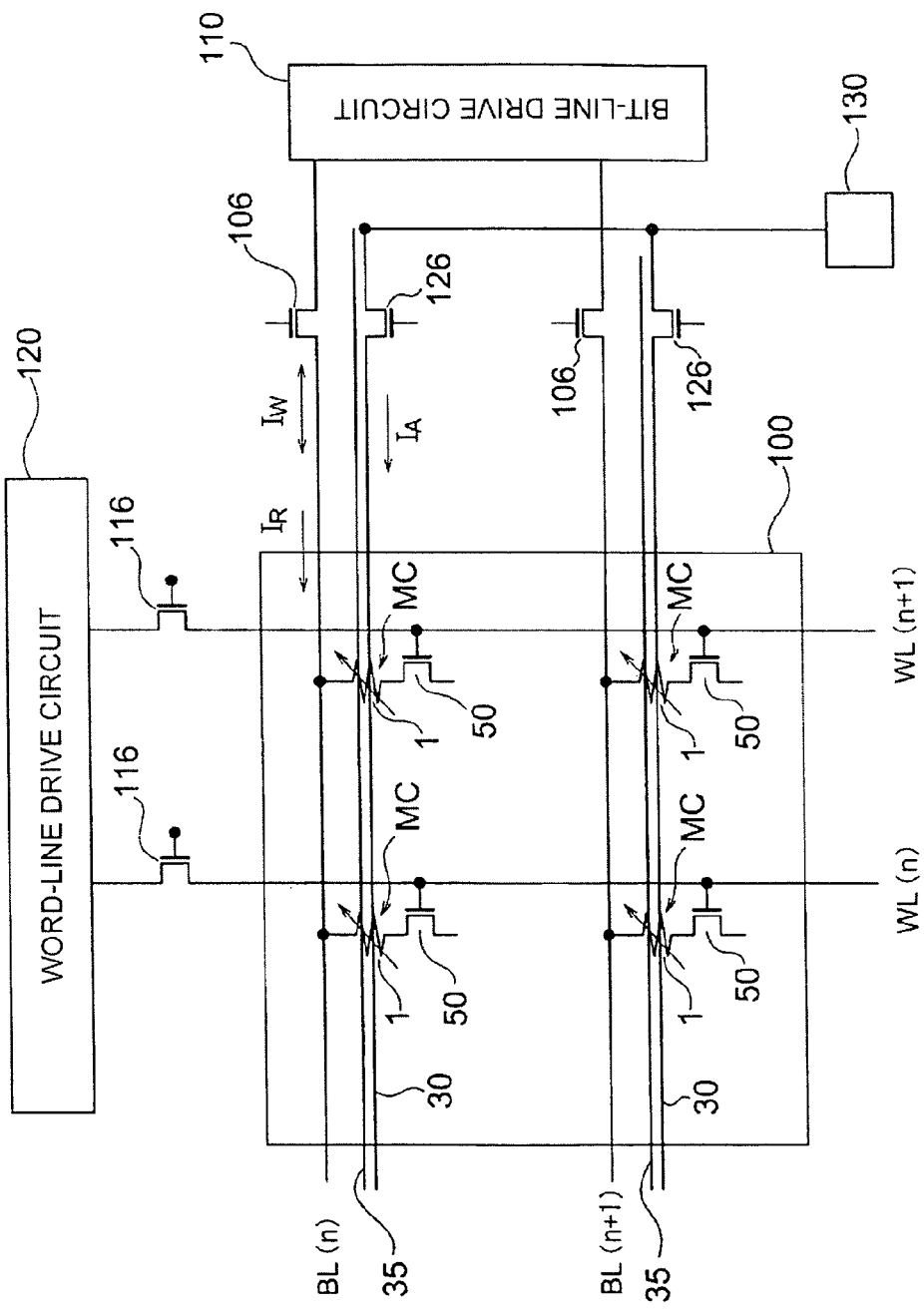
FIG. 12 is a connection diagram of a magnetic memory according to a first modified example of a first embodiment.

FIG. 12 shows a connection diagram of a magnetic memory according to the first modified example of the embodiment. The magnetic memory of the modified example is provided with a memory cell array 100 where a plurality of memory cells MC are arrayed in a matrix. Each memory cell MC is provided with a magnetic recording element 1 and a switching element 50 comprising an MOS transistor connected to the element 1 in series. A terminal of the magnetic recording element 1 of the memory cell MC located on the same row of the matrix is connected to the same bit line BL. Each bit line BL is connected to a bit-line drive circuit 110 via a selection element 106. In the memory cell array 100, the gate of the switching element 50 of the memory cell MC located on the same column of the matrix is connected to the same word line WL. Each word line WL is connected to a word-line drive circuit 120 via a selection element 116. And further, an RF interconnection 30 is provided in parallel to each bit line BL. The RF interconnection 30 is provided across an insulating layer above the magnetic recording element 1 to minimize a perpendicularly overlapping area between the interconnection and the bit line BL. Each RF interconnection 30 is connected to an oscillator 130 via a selection element 126. This ground line 35 is provided on the side opposite to the magnetic recording element 1 with respect to the RF interconnection 30, as shown in FIG. 1.

The oscillator 130 generates an RF current only at the time of write-in (recording). The oscillator 130 may be a spin torque oscillator comprising a ferromagnetic/a nonmagnetic material/a ferromagnetic material, or a magnetic oscillator comprising a layered structure of a magnetic fixed layer, an intermediate layer or a nonmagnetic barrier layer and a magnetic free layer. The bit-line drive circuit 110 includes a power supply for generating a write-in current $I_W$ whose pulse width is 50 psec or more and 18 nsec or less at the time of the write-in and for generating a read-out current $I_R$. The write-in current $I_W$ is passed through the magnetic recording element 1 via the bit line BL. The frequency of the RF current generated by the oscillator 130 is preferably 1 GHz or more. The above criterion of "1 GHz or more" means that the RF current with a frequency less than 1 GHz substantially brings about no advantageous effect on the magnetization reversal in relationship with a reversal time of the magnetic recording layer. A frequency of about 40 GHz was needed by the RF current to assist the magnetization reversal for the magnetic recording layer comprising a material with high $K_u$ (for example, about $1 \times 10^8$ erg/cm$^3$) according to experimental results by the present inventors.

Selection of the memory cell MC is made available by selecting the word line WL connected to the memory cell, bit line BL, and RF interconnection 30. At the time of write-in, the selection element 116 is turned on by selecting the word line WL, and the selection elements 106 and 126 are further turned on by selecting the RF interconnection 30. The action passes the write-in current $I_W$ into the memory cell MC, and simultaneously passes the RF current $I_A$ into the RF interconnection 30 to generate an RF field. The write-in may be achieved by passing the write-in current $I_W$ into the memory cell, wherein $I_W$ must be larger than the critical reversal current which depends on the size, structure, composition, etc. of the memory cell MC. A diode may be used as the selection elements 106, 116 and 126, as well. These selection elements 106, 116 and 126 are preferably provided with a low on-resistance.

At the time of read-in, selecting the word line and bit line turns on the selection elements 116 and 106 to pass the read-out current $I_R$ into the magnetic recording element 1 of the memory cell MC. Simultaneously turning off the selection element 126 for the RF interconnection 30 can expand the margin of the write-in and read-out current.

Providing the RF interconnection 30 leads to a reduction in variations in the magnetization reversals when the write-in current $I_W$ has a pulse width of 18 nsec or less. The variations are remarkably reduced in particular when the pulse width is 10 nsec or less. In addition, the current value of the write-in current $I_W$ can be also reduced. It can be seen from the simulation shown in FIG. 9 that passing the write-in current $I_W$ with a pulse width over 18 nsec yields a large amount of influence of heat generated thereby, the RF field bringing about no advantageous effect. It is preferable that the write-in current has a pulse width of less than 18 nsec, in particular, 10 nsec or less to obtain the remarkable effect for reducing variations in the magnetization reversals. On the other hand, when the pulse width is less than 50 psec, the write-in current tends to increase, as well as running short of the time required for reversing the magnetization of a magnetic recording layer in the magnetic recording element 1.

In the modified example, the RF interconnection 30 and the bit line BL are provided in parallel to minimize the overlapping area between the RF interconnection 30 and the bit line, as a line 18 electrically connected to the bit line is intersected perpendicularly with the RF interconnection 30. This structure also has an advantage of reducing areas occupied by interconnections.

Second Modified Example

Figure 13:
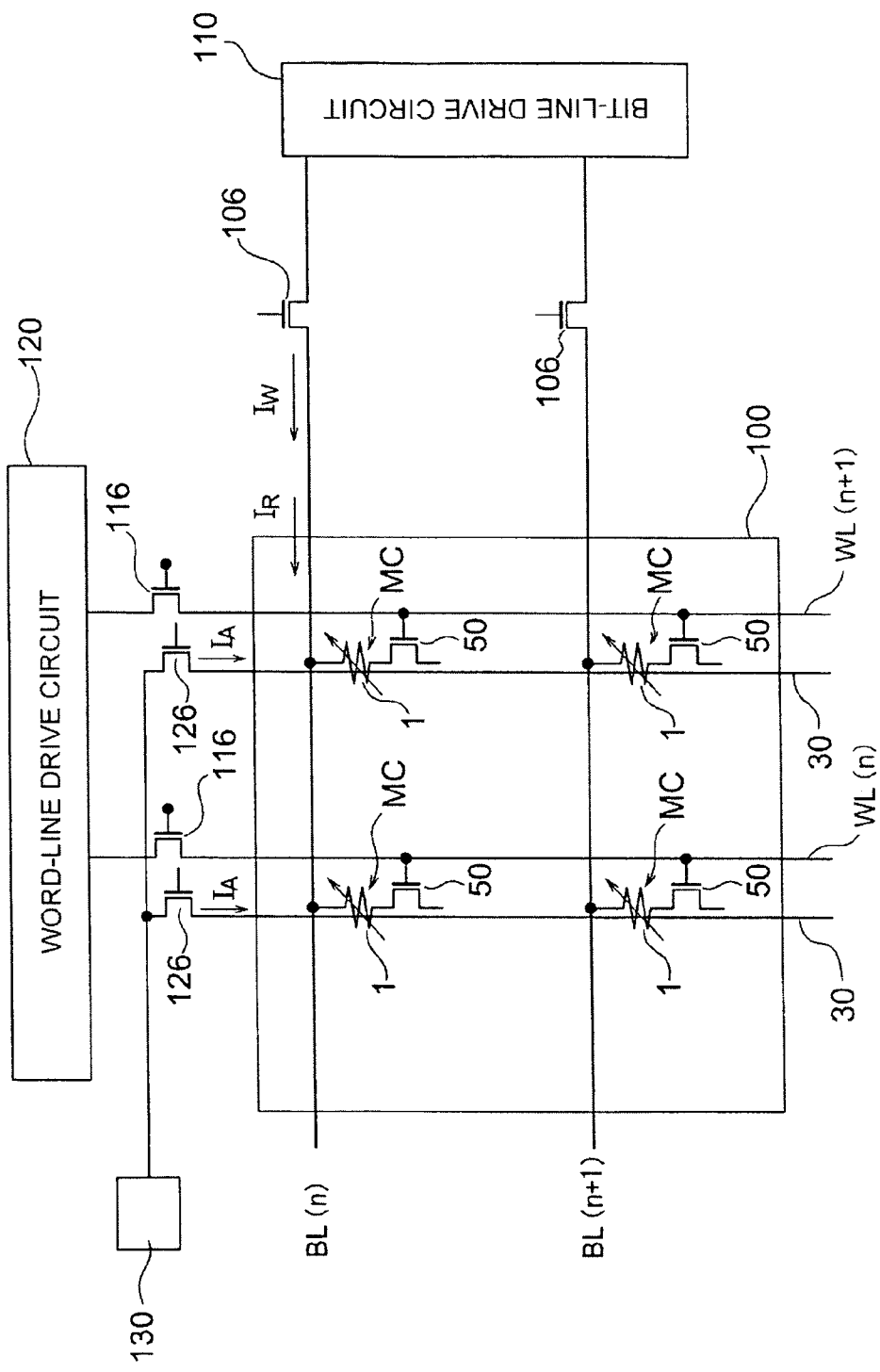
FIG. 13 is a connection diagram of a magnetic memory according to a second modified example of a first embodiment.

FIG. 13 shows a connection diagram of a magnetic memory in accordance with the second modified example of the embodiment. The magnetic memory of the modified example is provided with a memory cell array 100 where a plurality of memory cells MC are arrayed in a matrix. Each memory cell MC is provided with a magnetic recording element 1 and a switching element 50 comprising an MOS transistor connected to the magnetic recording element 1 in series. A terminal of the magnetic recording element 1 of the memory cell MC located on the same row is connected to the same bit line BL. Each bit line BL is connected to a bit-line drive circuit 110 via a selection element 106. In the memory cell array 100, the gate of the switching element 50 of the memory cell MC located on the same column is connected to the same word line WL. Each word line WL is connected to a word-line drive circuit 120 via a selection element 116. And further, an RF interconnection 30 is provided in parallel to each bit line BL. The RF interconnection 30 is provided across an insulating layer above the magnetic recording element to minimize perpendicularly overlapping area between the interconnection and the bit line BL. Each RF interconnection 30 is connected to an oscillator 130 via a selection element 126. A ground line 35 is provided in parallel to each RF interconnection 30. The ground line 35 is provided on the side opposite to the magnetic recording element 1 with respect to the RF interconnection 30.

The oscillator 130 generates an RF current only at the time of write-in (recording). The oscillator 130 may be a spin torque oscillator comprising a ferromagnetic/a nonmagnetic material/a ferromagnetic material, or a magnetic oscillator comprising a layered structure of a magnetic fixed layer, an intermediate layer or a nonmagnetic barrier layer and a magnetic free layer.

The bit-line drive circuit 110 includes a power supply for generating a write-in current $I_W$ whose pulse width is 50 psec or more and 18 nsec or less at the time of write-in and for generating a read-out current $I_R$. The write-in current $I_W$ is passed through the magnetic recording element 1 via the bit line BL. The frequency of the RF current generated by the oscillator 130 is preferably 1 GHz or more. The above criterion of "1 GHz or more" means that the RF current with a frequency less than 1 GHz substantially brings about no advantageous effect on the magnetization reversal in relationship with a reversal time of a magnetic recording layer in the magnetic recording element 1.

The write-in and read-out operations in the second modified example can be performed in the same way as the first modified example.

As mentioned above, according to the embodiment, it is possible to reduce variations in the "spin-polarized current direct driving magnetization reversals", achieving a reduction in the reversal current and a rapid magnetization reversal as well. And it is also possible to pass an RF current with sufficient RF transmissivity.

Second Embodiment

Next, the magnetic memory of the second embodiment is explained with reference to FIGS. 14A and 14B. FIGS. 14A and 14B show the sectional views of the memory cell of the magnetic memory according to the embodiment, and the sectional views are taken perpendicularly to each other.

A magnetic memory of the embodiment is provided with a plurality of memory cells MC arrayed in a matrix. Each memory cell is provided with a magnetic recording element 1, an RF interconnection 30, a ground interconnection 35, an extraction electrode 40, a connecting plug 45 and a switching element 50. The magnetic memory of the embodiment has a setup where the bit line doubles as the RF interconnection in comparison with the magnetic memory of the first embodiment shown in FIG. 1. For the reason, the RF interconnection 30 is connected to the upper terminal of the magnetic recording element 1, extending along a direction intersecting perpendicularly with a word line 60. This point is quite different from the first embodiment. The ground line 35 is provided along the RF interconnection 30 across an insulating layer to extend along the direction intersecting perpendicularly with the word line 60.

The bit line doubles as the RF interconnection differently from the first embodiment. A DC power supply and the oscillator for generating an RF current are, therefore, connected to the bit line (the RF interconnection). This enlarges a margin of write-in and read-out by passing the RF current from the oscillator only at the time of the write-in. Although a line for an RF current and a line for a write-in current are not independent of each other, the RF current 32 flows into the bit line (the RF interconnection) only, and does not flow into the magnetic recording element 1.

The related art was disclosed in the U.S. patent application 2007/0047294. The art disclosed that an RF current was supplied through the bit line 330 to the magnetic recording element 410, which is provided with the switching element 420 connected to the recording element in series and the memory cell 100, to generate the resonant RF magnetic field. However, according to the related art, the memory device is not provided with a ground line. This point is quite different from the embodiment of the present invention. For the reason, the reflectance will increase while the transmissivity will decline in the RF range, as seen in the simulation of the transmissivity of the RF current shown in FIG. 11 of the above detailed description. The RF current cannot be passed via the bit line without a ground line, and the effect which has been disclosed in the embodiment will not be able to be acquired in the related art.

Shapes and materials of the magnetic recording element 1, the RF interconnection 30, the switching element 50 and the ground line 35 of the second embodiment can be made to be the same as that of the first embodiment.

The write-in and read-out for the magnetic recording element 1 can be performed in the same way as the first embodiment.

According to the embodiment, it is possible to reduce variations in the "spin-polarized current direct driving magnetization reversals", achieving a reduction in the reversal current and a rapid magnetization reversal as well as the first embodiment. Furthermore, the RF current can be passed through with sufficient RF transmissivity.

Third Embodiment

Figure 15B:
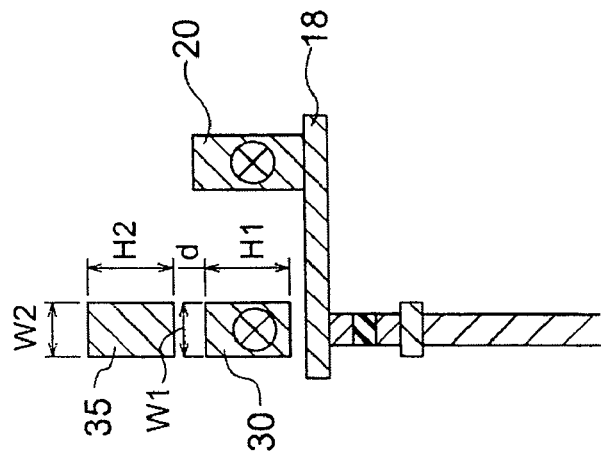
FIGS. 15A and 15B are sectional views of a memory cell for a magnetic memory according to a third embodiment of the invention.
Figure 15A:
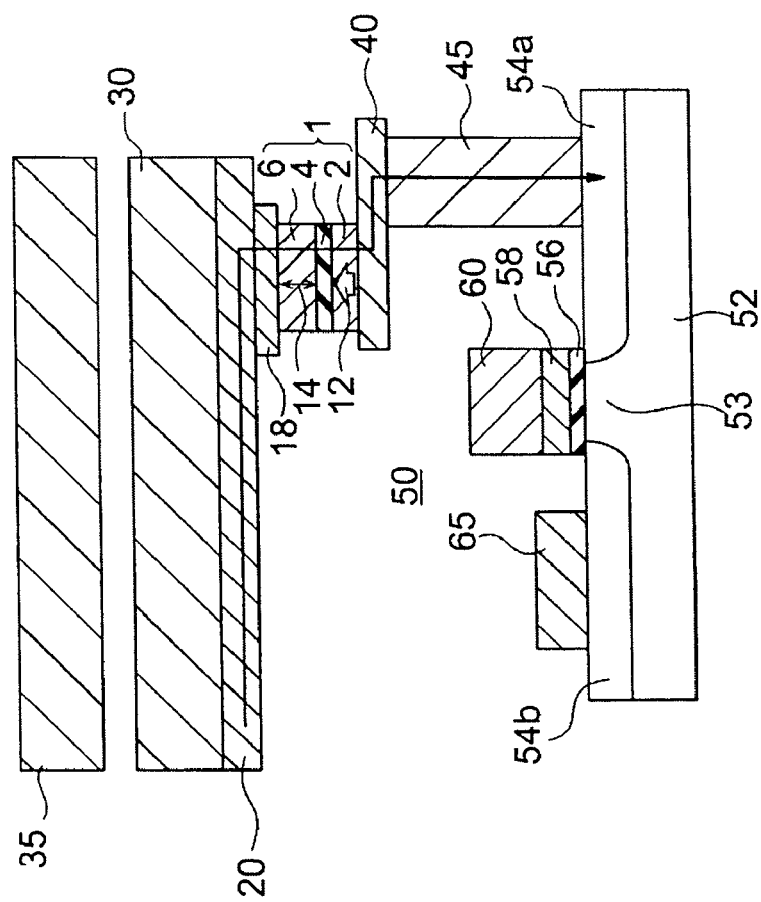

The magnetic memory of the third embodiment will be explained with reference to FIGS. 15A and 15B. FIGS. 15A and 15B show sectional views of the memory cell of the magnetic memory according to the embodiment, and the sectional views are taken perpendicularly to each other.

A magnetic memory of the embodiment is provided with a plurality of memory cells MC arrayed in a matrix. Each memory cell is provided with a magnetic recording element 1, an extraction electrode 18, an RF interconnection 30, a ground interconnection 35, an extraction electrode 40, a connecting plug 45 and a switching element 50. The magnetic memory has a setup where a bit line 20 is connected to the magnetic recording element 1 via the extraction electrode 18, and the RF interconnection 30 is provided on the side opposite to the magnetic recording element 1 with respect to the extraction electrode 18 (Refer to FIGS. 15A and 15B). Therefore, the bit line 20 is provided at the side of the RF interconnection 30 across an insulating layer not shown (refer to FIG. 15B). And the RF interconnection 30 extends along the direction of the bit line 20, intersecting perpendicularly with a word line 60. This point is quite different from the first embodiment. The ground line is provided along the RF interconnection 30 via an insulating layer not shown, that is, extends along the direction parallel to the bit line 20, intersecting perpendicularly with the word line 60.

Shapes and materials of the magnetic recording element 1, RF interconnection 30, ground line 35 and switching element 50 of the third embodiment can be made to be the same as that of the first embodiment.

The write-in and read-out for the magnetic recording element 1 can be performed in the same way as the first embodiment.

According to the embodiment, it is possible to reduce variations in the "spin-polarized current direct driving magnetization reversals", achieving the reduction in the reversal current and the rapid magnetization reversal as well as the first embodiment. Furthermore, an RF current can be passed through with sufficient RF transmissivity.

The embodiments of the present invention have been described above. However, the present invention is not limited to the embodiments. For example, when those skilled in the art appropriately select to combine two or more of the examples as described above from a known range, and the same effect as described above can be obtained, they are also incorporated in the present invention. For example, the magnetic fixed layer of the magnetic recording element may be an antiferromagnetic layer. It may be also a synthetic antiferromagnetic layer. The upper and bottom layers of the magnetic recording element of the present invention may be interchanged. Each element included in the embodiments described above can be combined as long as it is technically possible, and then what combined the elements is also included by the range of the present invention as long as it includes the feature of the present invention.

What is claimed is:

1. A magnetic memory which is provided with a memory cell, the memory cell including a magnetic recording element, an interconnection and a ground line,
the magnetic recording element comprising:
a first magnetic layer whose magnetization direction is substantially fixed;
a magnetic recording layer whose magnetization direction is substantially reversed by spin-polarized electrons passing through the magnetic recording layer; and
a first nonmagnetic layer provided between the first magnetic layer and the magnetic recording layer,
wherein the interconnection is provided above the magnetic recording element to generate a radio-frequency current-induced magnetic field, the radio-frequency current-induced magnetic field acting in a direction substantially perpendicular to a magnetization easy axis of the magnetic recording layer, by passing a radio-frequency current through the interconnection, and
the ground line is provided on a side opposite to the magnetic recording element with respect to the interconnection.

2. The magnetic memory according to claim 1, further comprising a bit line, the bit line being insulated electrically with the interconnection and being connected electrically to the magnetic recording element.

3. The magnetic memory according to claim 2, wherein the bit line is provided between the magnetic recording element and the interconnection.

4. The magnetic memory according to claim 2, wherein the bit line is provided in parallel with the interconnection.

5. The magnetic memory according to claim 1, wherein $H1 \geq d \geq W1/10$ and $H2 \geq d \geq W2/10$, where W1 and H1 represent a width and height of the interconnection, respectively, W2 and H2 represent a width and height of the ground line, respectively, and d represents a distance between the interconnection and the ground line.

6. The magnetic memory according to claim 1, wherein the interconnection is electrically connected to the magnetic recording element.

7. The magnetic memory according to claim 1, wherein the magnetic recording layer has a surface and a magnetization direction of the magnetic recording layer is substantially perpendicular to the surface.

8. The magnetic memory according to claim 1, wherein the magnetic recording element further comprises:
a second magnetic layer whose magnetization direction is substantially fixed, the second magnetic layer having a first surface and a second surface; and
a second nonmagnetic layer which is in contact with the first surface and a surface of the magnetic recording layer.

9. The magnetic memory according to claim 1, further comprising:
a power supply capable of supplying a write-in current with a pulse width of 50 picoseconds or more to 18 nanoseconds or less to reverse a magnetization of the magnetic recording layer of the magnetic recording element; and
an oscillator to pass a radio-frequency current with a frequency of 1 GHz or more through the interconnection.

10. The magnetic memory according to claim 9, wherein the oscillator has a layered structure including a first magnetic layer, a second magnetic layer, and a nonmagnetic layer sandwiched between the first and second ferromagnetic layers.

11. A magnetic memory which is provided with a memory cell, the memory cell including a magnetic recording element, a bit line, an interconnection and a ground line,
the magnetic recording element comprising:
a first magnetic layer whose magnetization direction is substantially fixed;
a magnetic recording layer whose magnetization is substantially reversed by spin-polarized electrons passing through the magnetic recording layer; and
a first nonmagnetic layer provided between the first magnetic layer and the magnetic recording layer,
wherein the interconnection is provided on a side opposite to the magnetic recording element with respect to the bit line, the interconnection extending along a direction substantially perpendicular to a direction along which the bit line extends, and
the ground line is provided on a side opposite to the magnetic recording element with respect to the interconnection.

12. The magnetic memory according to claim 11, wherein the interconnection is electrically connected to the magnetic recording element.

13. The magnetic memory according to claim 11, wherein the magnetic recording layer included in the recording element has a surface, and a magnetization direction of the layer is substantially perpendicular to the surface.

14. The magnetic memory according to claim 11, wherein the magnetic recording element further comprises:
a second magnetic layer whose magnetization is substantially fixed, the second magnetic layer having a first surface and a second surface; and
a second nonmagnetic layer which is in contact with the first surface and a surface of the magnetic recording layer.

15. The magnetic memory according to claim 11, further comprising:
a power supply capable of supplying a write-in current with a pulse width of 50 picoseconds or more to 18 nanoseconds or less to reverse a magnetization of the magnetic recording layer of the magnetic recording element; and
an oscillator to pass a radio-frequency current with a frequency of 1 GHz or more through the interconnection.

16. The magnetic memory according to claim 15, wherein the oscillator has a layered structure including a first ferromagnetic layer, a second ferromagnetic layer and a nonmagnetic layer sandwiched between the first and second ferromagnetic layers.

* * * * *